United States Patent
Chang et al.

(10) Patent No.: US 10,522,536 B2
(45) Date of Patent: Dec. 31, 2019

(54) STRUCTURE AND FORMATION METHOD OF SEMICONDUCTOR DEVICE WITH GATE STACKS

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 509 days.

(21) Appl. No.: 15/227,207

(22) Filed: Aug. 3, 2016

(65) Prior Publication Data
US 2018/0040613 A1  Feb. 8, 2018

(51) Int. Cl.
| H01L 27/088 | (2006.01) |
| H01L 23/31 | (2006.01) |
| H01L 29/06 | (2006.01) |
| H01L 29/66 | (2006.01) |
| H01L 21/8234 | (2006.01) |

(52) U.S. Cl.
CPC .. *H01L 27/0886* (2013.01); *H01L 21/823431* (2013.01); *H01L 21/823437* (2013.01); *H01L 23/3171* (2013.01); *H01L 29/0649* (2013.01); *H01L 29/66545* (2013.01)

(58) Field of Classification Search
None
See application file for complete search history.

(56) References Cited

U.S. PATENT DOCUMENTS

| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |

(Continued)

*Primary Examiner* — Hoang-Quan T Ho
(74) *Attorney, Agent, or Firm* — Birch, Stewart, Kolasch & Birch, LLP

(57) ABSTRACT

Structures and formation methods of a semiconductor device are provided. The semiconductor device includes a substrate and a first fin structure and a second fin structure over the substrate. The semiconductor device also includes a first gate stack and a second gate stack partially covering the first fin structure and the second fin structure, respectively, and a stack structure over the substrate. The stack structure is between the first gate stack and the second gate stack. The stack structure includes a semiconductor layer over the substrate and a protection layer over the semiconductor layer.

20 Claims, 30 Drawing Sheets

(56) References Cited

U.S. PATENT DOCUMENTS

| | | |
|---|---|---|
| 2014/0001574 A1 | 1/2014 | Chen et al. |
| 2014/0110755 A1 | 4/2014 | Colinge |
| 2014/0151812 A1 | 6/2014 | Liaw |
| 2015/0115363 A1* | 4/2015 | Chang ............. H01L 21/823431 257/347 |
| 2015/0115373 A1* | 4/2015 | Yu ................... H01L 21/823418 257/401 |
| 2015/0325575 A1* | 11/2015 | Park .................... H01L 29/0653 257/401 |
| 2016/0148935 A1* | 5/2016 | Chen ............... H01L 21/823878 257/369 |

* cited by examiner

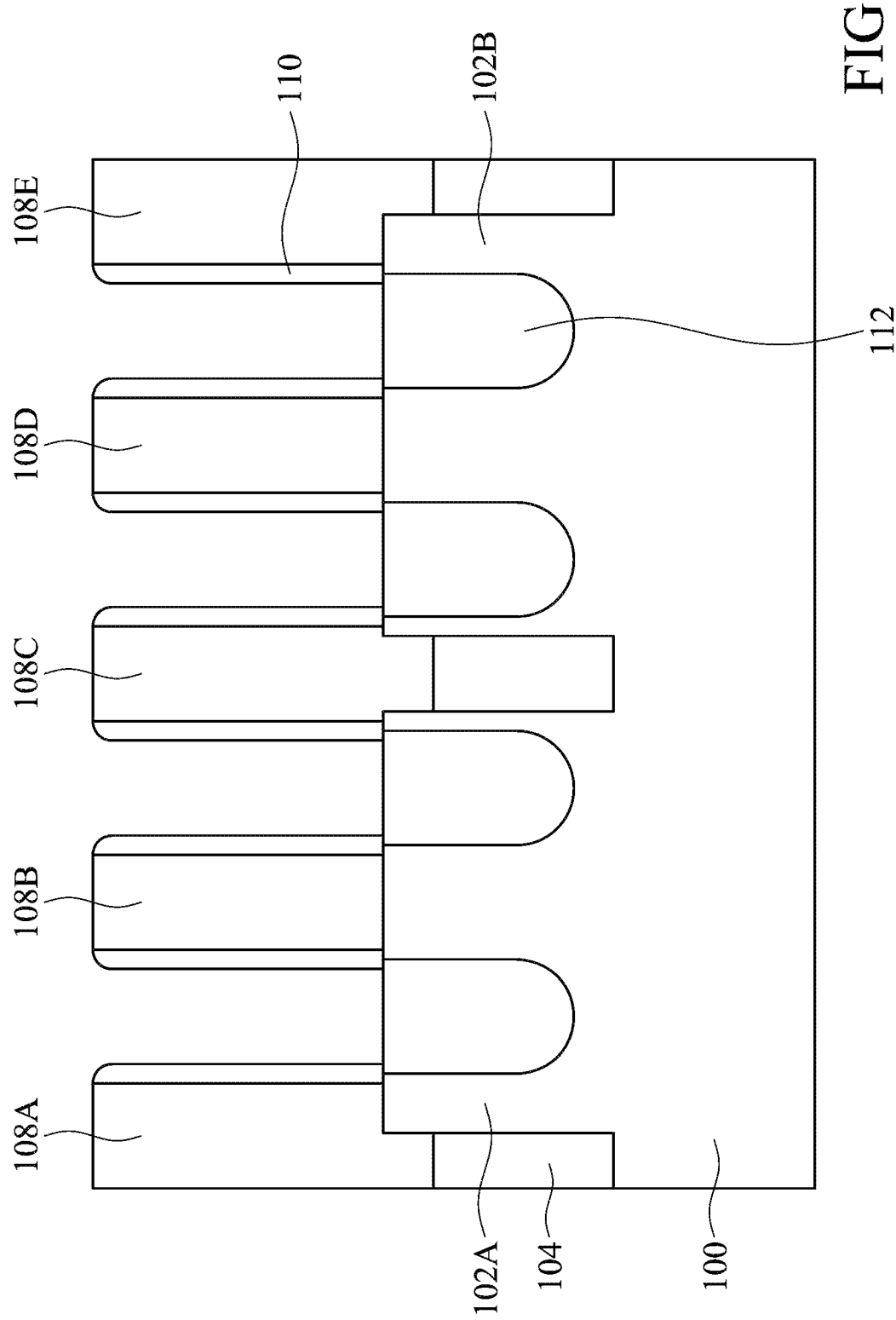

STRUCTURE AND FORMATION METHOD OF SEMICONDUCTOR DEVICE WITH GATE STACKS

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. The scaling-down process generally provides benefits by increasing production efficiency and lowering associated costs.

Despite groundbreaking advances in materials and fabrication, scaling planar devices such as the metal-oxide-semiconductor field effect transistor (MOSFET) device has proven challenging. To overcome these challenges, circuit designers look to novel structures to deliver improved performance, which has resulted in the development of three-dimensional designs, such as fin-like field effect transistors (FinFETs). The FinFET is fabricated with a thin vertical "fin" (or fin structure) extending up from a substrate. The channel of the FinFET is formed in this vertical fin. A gate is provided over the fin to allow the gate to control the channel from multiple sides. Advantages of the FinFET may include a reduction of the short channel effect, reduced leakage, and higher current flow.

However, since feature sizes continue to decrease, fabrication processes continue to become more difficult to perform. Therefore, it is a challenge to form a reliable semiconductor device including the FinFET.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1K are cross-sectional views of various stages of a process for forming a semiconductor device, in accordance with some embodiments.

DETAILED DESCRIPTION

Figure 1A:
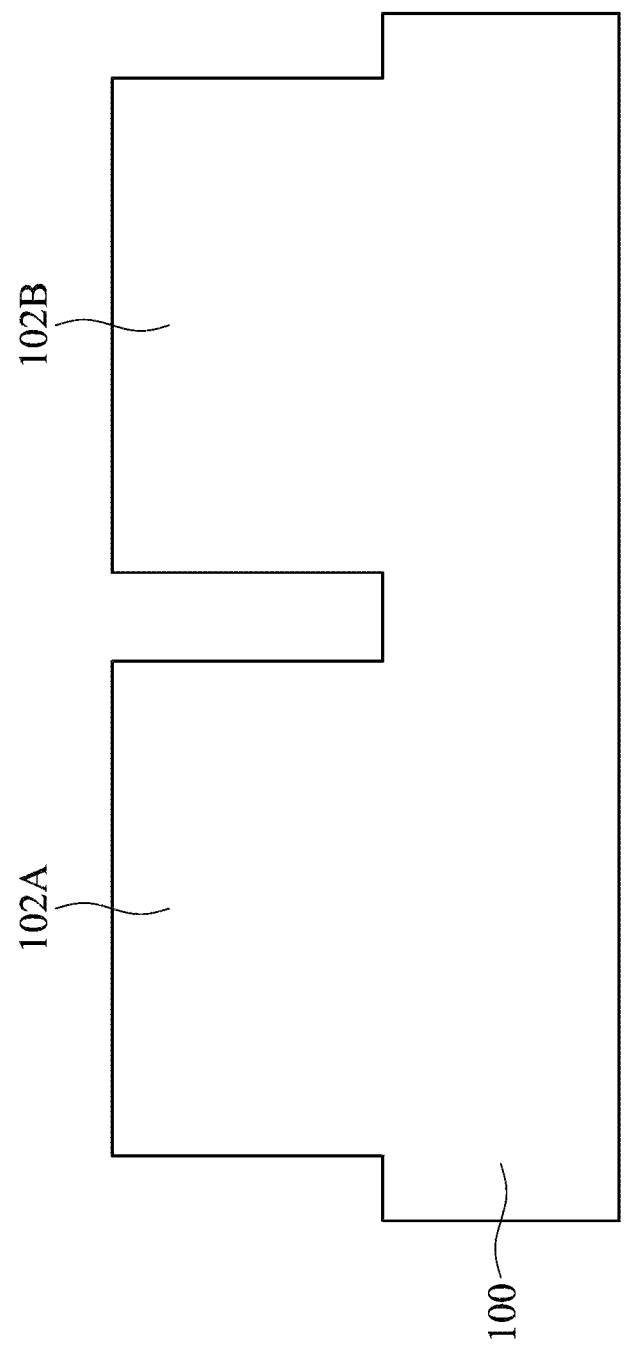

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1K are cross-sectional views of various stages of a process for forming a semiconductor device, in accordance with some embodiments. FIGS. 2A-2K are perspective views of various stages of a process for forming a semiconductor device, in accordance with some embodiments. For example, FIGS. 1A-1K are cross-sectional views taken along line A-A in FIGS. 2A-2K. Additional operations can be provided before, during, and/or after the stages described in Figs. Some of the stages described can be replaced or eliminated for different embodiments. Additional features can be added in the semiconductor device. Some of the features described below can be replaced or eliminated for different embodiments. Although some embodiments are discussed with operations performed in a particular order, these operations may be performed in another logical order.

Figure 2A:
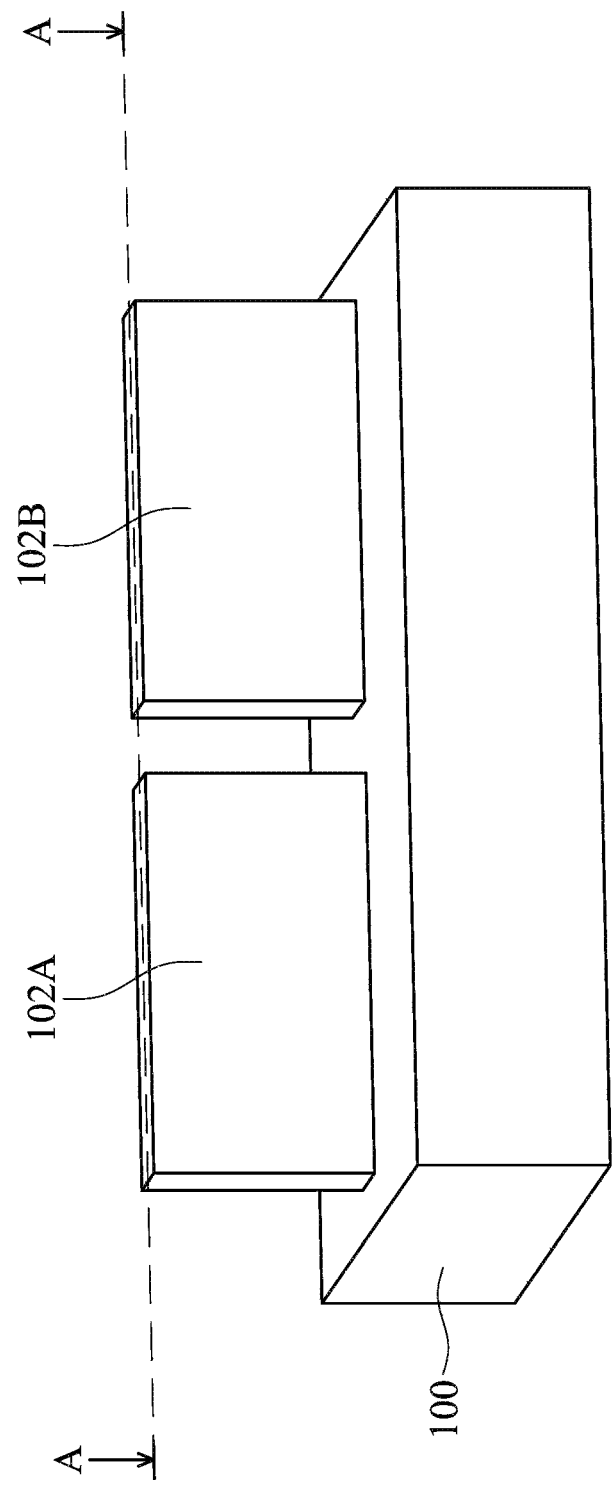
FIGS. 2A-2K are perspective views of various stages of a process for forming a semiconductor device, in accordance with some embodiments.

As shown in FIGS. 1A and 2A, multiple fin structures including fin structures 102A and 102B are formed over a semiconductor substrate 100, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, various device elements are formed in the semiconductor substrate 100. Examples of the various device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, or other suitable elements. Various processes may be used to form the various device elements, including deposition, etching, implantation, photolithography, annealing, and/or other suitable processes.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

In some embodiments, multiple recesses (or trenches) are formed in the semiconductor substrate 100. As a result, multiple fin structures including the fin structures 102A and 102B are formed between the recesses. In some embodiments, one or more photolithography and etching processes are used to form the recesses.

Figure 1B:
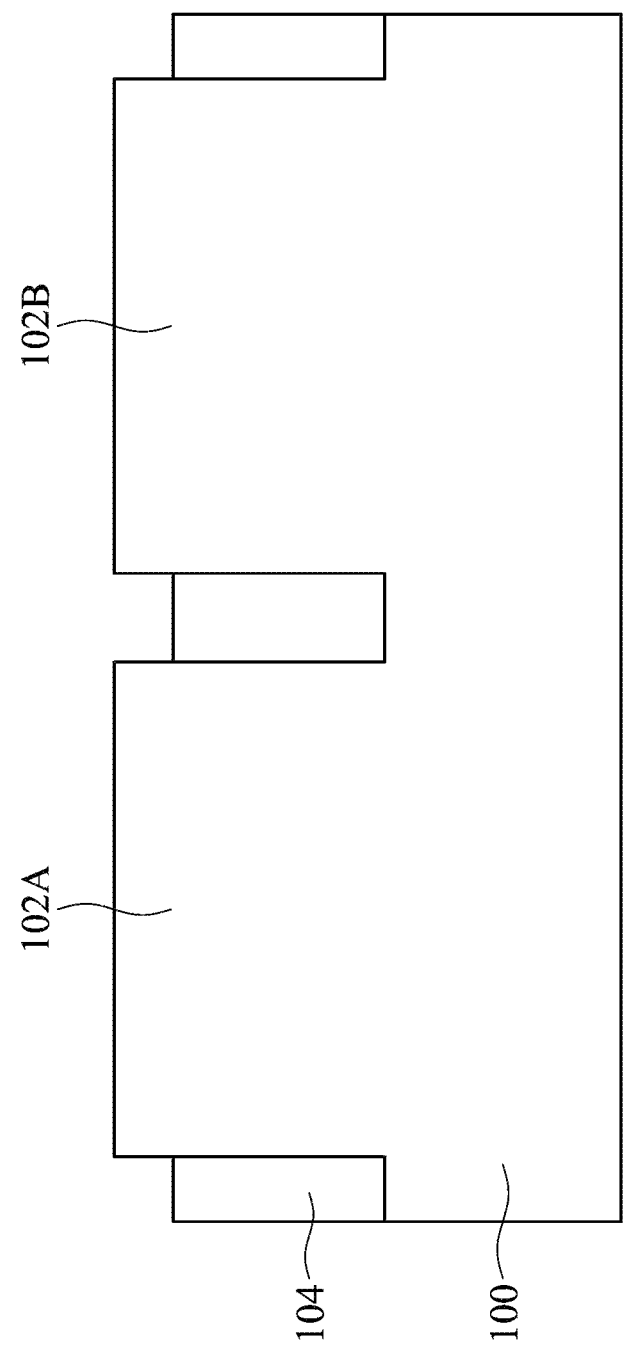
Figure 2B:
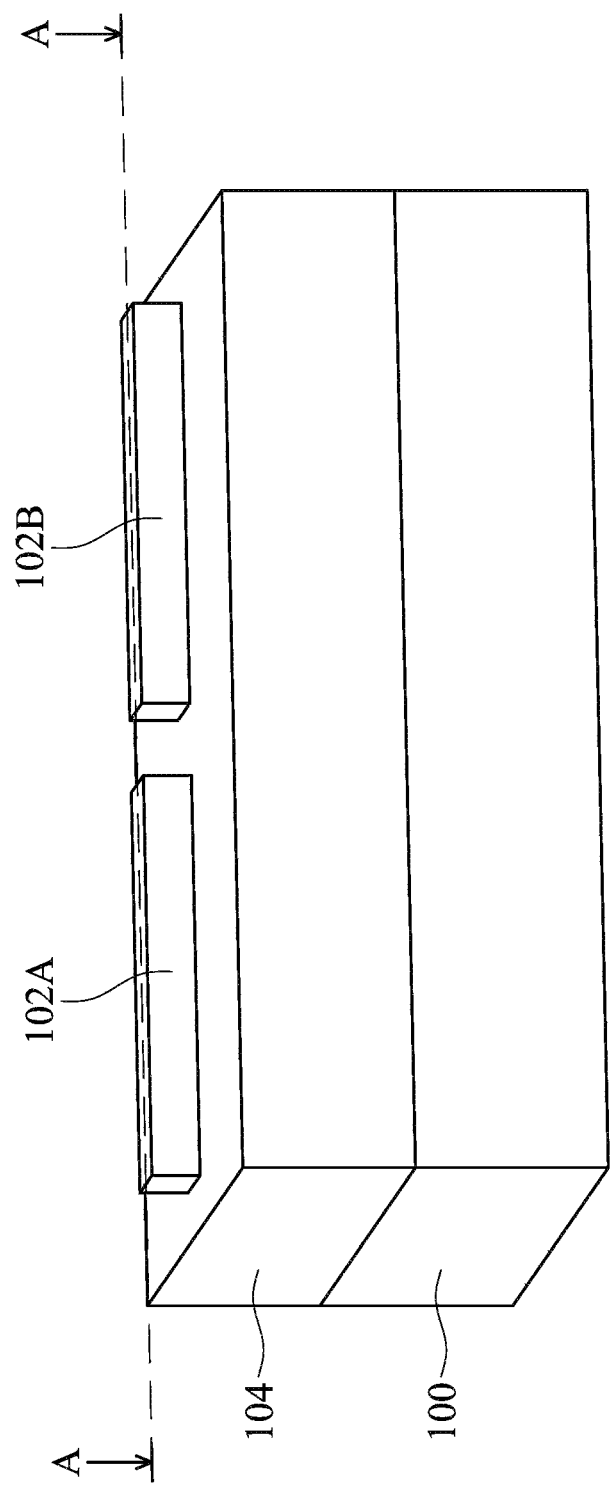

As shown in FIGS. 1B and 2B, one or more isolation structures including an isolation structure 104 are formed over the semiconductor substrate 100 and formed in the recesses to surround lower portions of the fin structures including the fin structures 102A and 102B, in accordance with some embodiments. The isolation structure 104 is adjacent to the fin structures 102A and 102B. In some embodiments, the isolation structure 104 continuously surrounds the lower portions of the fin structures 102A and 102B. Upper portions of the fin structures $102N_1$, $102N_2$, $102P_1$, and $102P_2$ protrude from the top surfaces of the isolation features 103.

The isolation structure 104 is used to define and electrically isolate various device elements formed in and/or over the semiconductor substrate 100. In some embodiments, the isolation structure 104 includes a shallow trench isolation (STI) feature, a local oxidation of silicon (LOCOS) feature, another suitable isolation structure, or a combination thereof.

In some embodiments, the isolation structure 104 has a multi-layer structure. In some embodiments, the isolation structure 104 is made of a dielectric material. The dielectric material may include silicon oxide, silicon nitride, silicon oxynitride, fluoride-doped silicate glass (FSG), low-K dielectric material, another suitable material, or a combination thereof. In some embodiments, an STI liner (not shown) is formed to reduce crystalline defects at the interface between the semiconductor substrate 100 and the isolation structure 104. The STI liner may also be used to reduce crystalline defects at the interface between the fin structures and the isolation structure 104.

In some embodiments, a dielectric layer is deposited over the semiconductor substrate 100 using a chemical vapor deposition (CVD) process, a spin-on process, another applicable process, or a combination thereof. The dielectric layer covers the fin structures including the fin structures 102A and 102B and fills the recesses between the fin structures. In some embodiments, a planarization process is performed to thin down the dielectric layer. For example, the dielectric layer is thinned until the fin structures 102A and 102B are exposed. The planarization process may include a chemical mechanical polishing (CMP) process, a grinding process, a dry polishing process, an etching process, another applicable process, or a combination thereof. Afterwards, the dielectric layer is etched back to be below the top of the fin structures 102A and 102B. As a result, the isolation structure 104 is formed. The fin structures 102A and 102B protrude from the top surface of the isolation structure 104, as shown in FIGS. 1B and 2B in accordance with some embodiments.

Figure 1C:
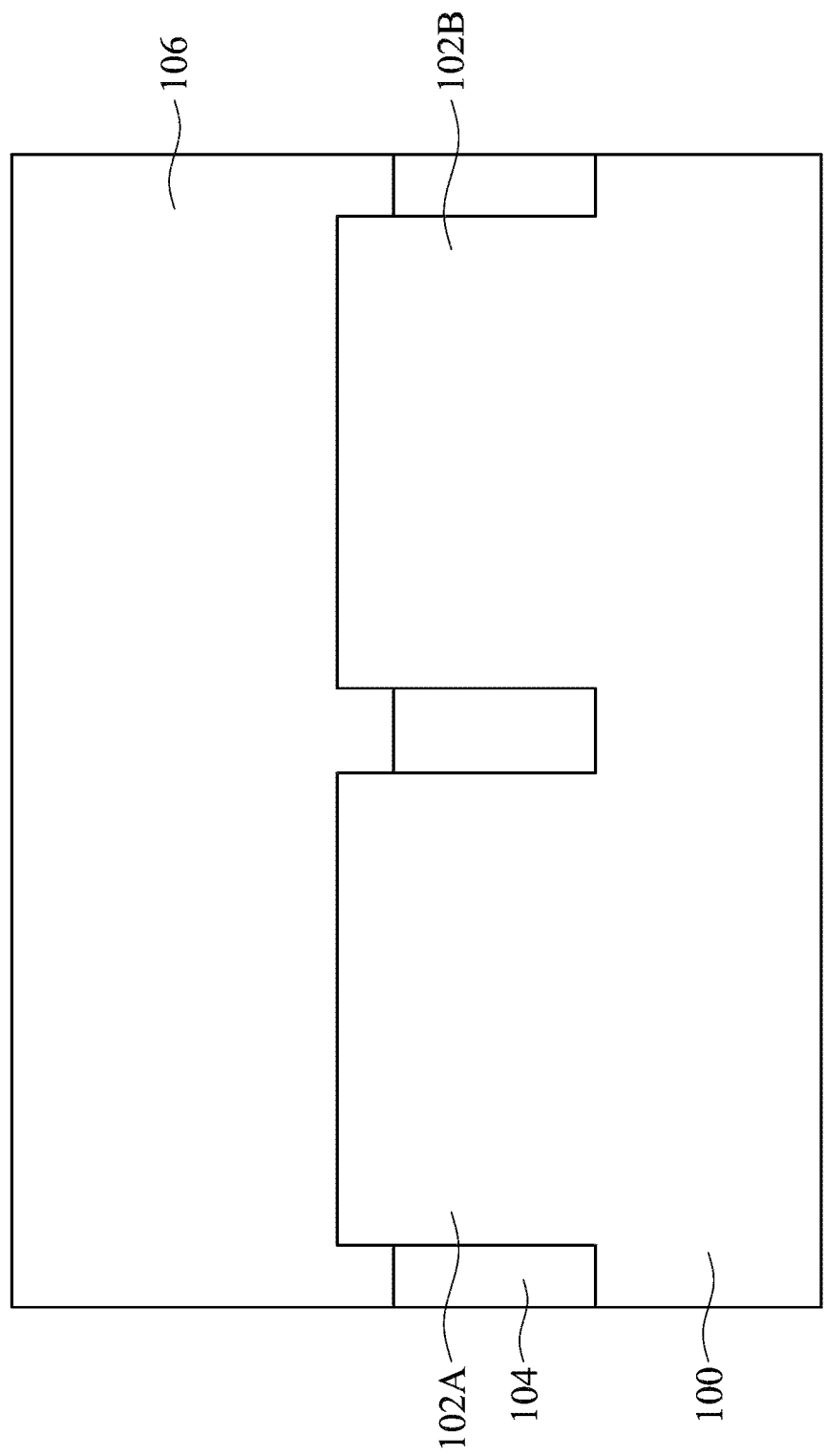
Figure 2C:
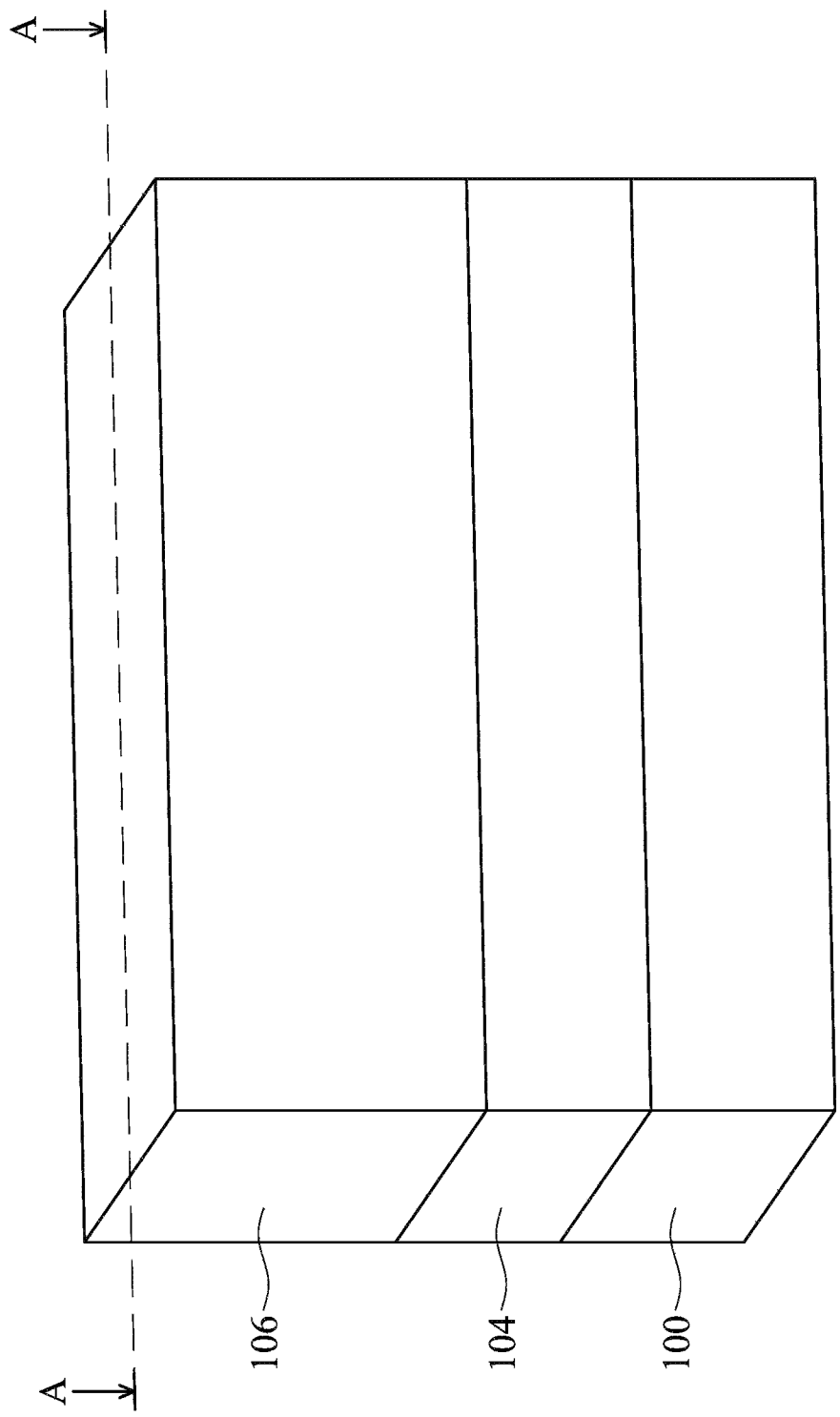

As shown in FIGS. 1C and 2C, a gate electrode layer 106 is deposited over the isolation feature 104 and the fin structures 102A and 102B, in accordance with some embodiments. In some embodiments, the gate electrode layer 106 is made of polysilicon. In some embodiments, the gate electrode layer 106 may be deposited using a chemical vapor deposition CVD process or another applicable process.

In addition, in some embodiments, an interfacial layer (not shown) is deposited over the fin structures 102A and 102B before the deposition of the gate electrode layer 106. In some embodiments of the present disclosure, the interfacial layer is made of silicon oxide, silicon nitride, silicon oxynitride and is deposited using a chemical vapor deposition (CVD) process, an atomic layer deposition (ALD) process, a thermal oxidation process, another applicable process, or a combination thereof.

Figure 1D:
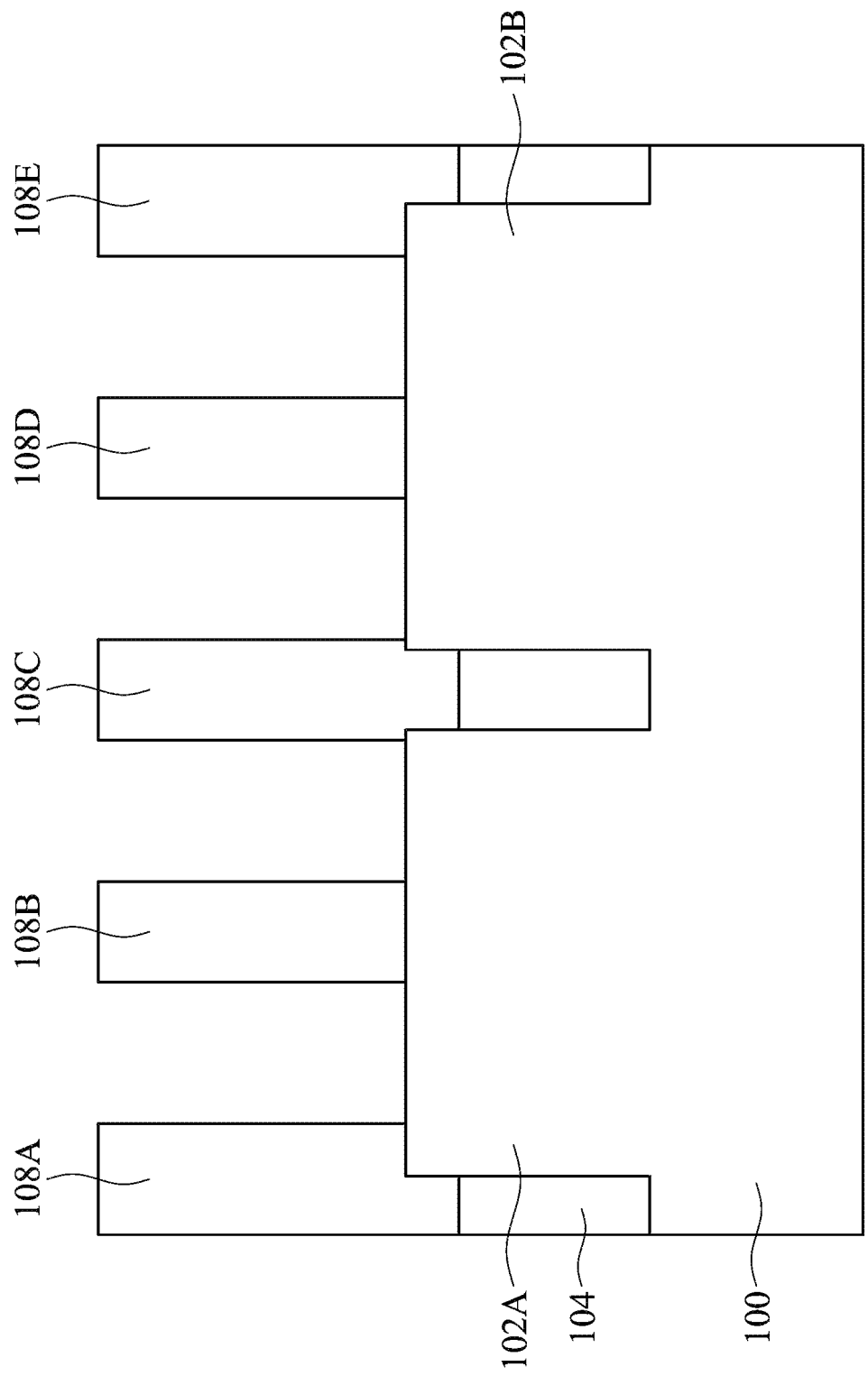
Figure 2D:
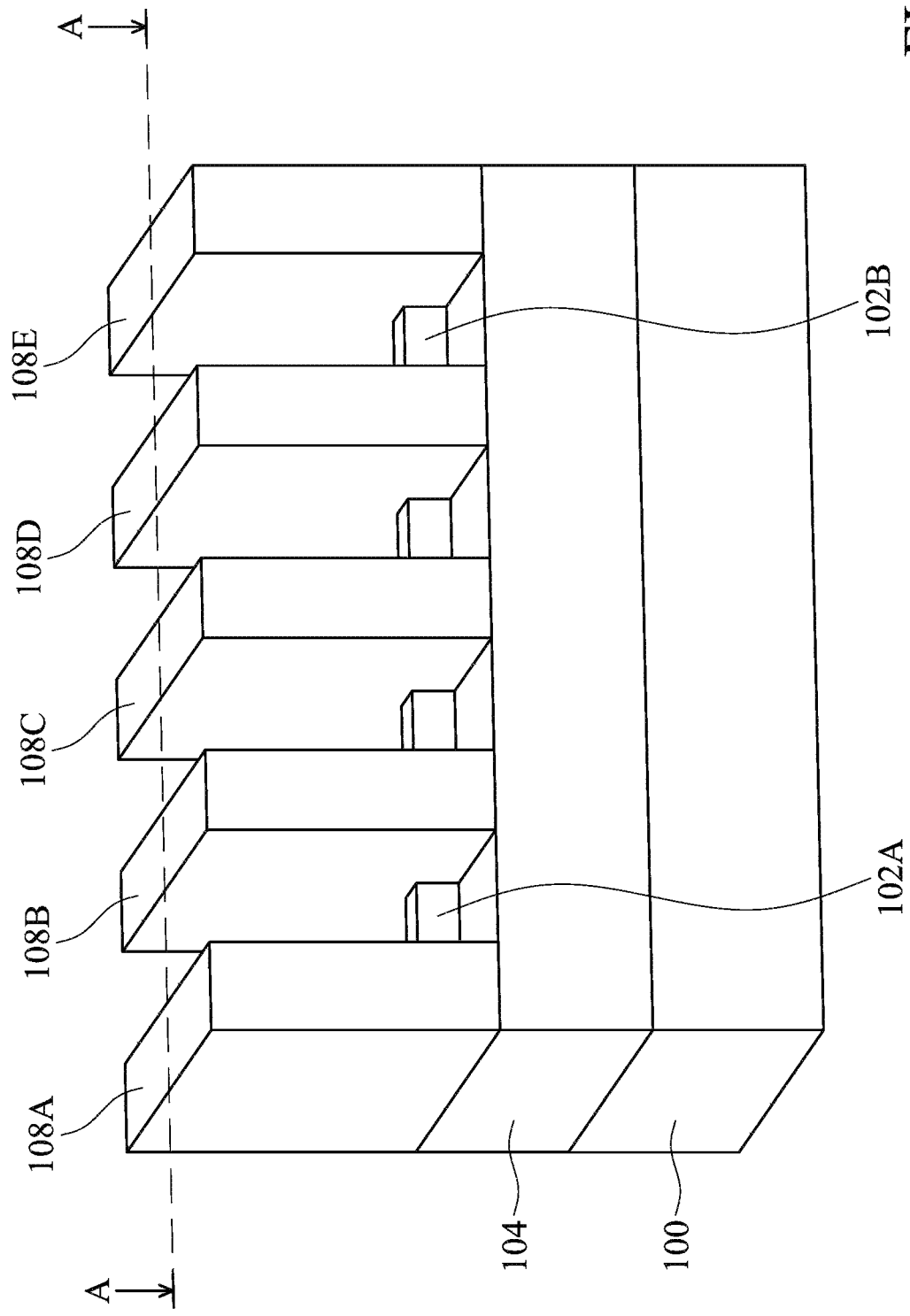

Afterwards, as shown in FIGS. 1D and 2D, the gate electrode layer 106 are patterned to form dummy gate stacks 108A, 108B, 108C, 108D and 108E, in accordance with some embodiments. As shown in FIGS. 1D and 2D, the dummy gate stack 108B is formed over the fin structure 102A and partially covers the fin structure 102A, in accordance with some embodiments. In addition, as shown in FIGS. 1D and 2D, the dummy gate stack 108B traverses over the fin structure 102A, in accordance with some embodiments.

In addition, as shown in FIGS. 1D and 2D, the dummy gate stack 108D is formed over the fin structure 102B and partially covers the fin structure 102B, in accordance with some embodiments. In addition, as shown in FIGS. 1D and 2D, the dummy gate stack 108D traverses over the fin structure 102B, in accordance with some embodiments.

As shown in FIGS. 1D and 2D, the dummy gate stacks 108A and 108C are positioned at opposite ends of the fin structure 102A, in accordance with some embodiments. As shown in FIGS. 1D and 2D, the dummy gate stacks 108C and 108E are positioned at opposite ends of the fin structure 102B, in accordance with some embodiments.

In addition, as shown in FIGS. 1D and 2D, the dummy gate stack 108C is formed between the dummy gate stacks 108B and 108D, in accordance with some embodiments. In some embodiments of the present disclosure, the dummy gate stack 108C is formed over a portion of the fin structure 102A, a portion of the fin structure 102B and over the isolation structure 104 between the fin structures 102A and 102B.

In some embodiments of the present disclosure, a patterned hard mask layer (not shown) is formed over the gate electrode layer 106 shown in FIGS. 1C and 2C, the patterned hard mask layer is used to pattern the gate electrode layer 106 into one or more gate electrodes including the dummy gate stacks 108A, 108B, 108C, 108D and 108E, as shown in FIGS. 1D and 2D.

In some embodiments, portions of the gate electrode layer 106 are removed. As a result, the remaining portions of the gate electrode layer 106 form the dummy gate stacks 108A, 108B, 108C, 108D and 108E.

In some embodiments, the portions of the gate electrode layer 106 are removed using a wet etching process. For example, an etching solution containing $NH_4OH$ solution, dilute-HF, other suitable etching solution, or a combination thereof may be used. In some embodiments, the portions of the gate electrode layer 106 are removed using a dry etching process. Example etchants includes fluorine and/or chlorine based etchants.

Figure 2E:
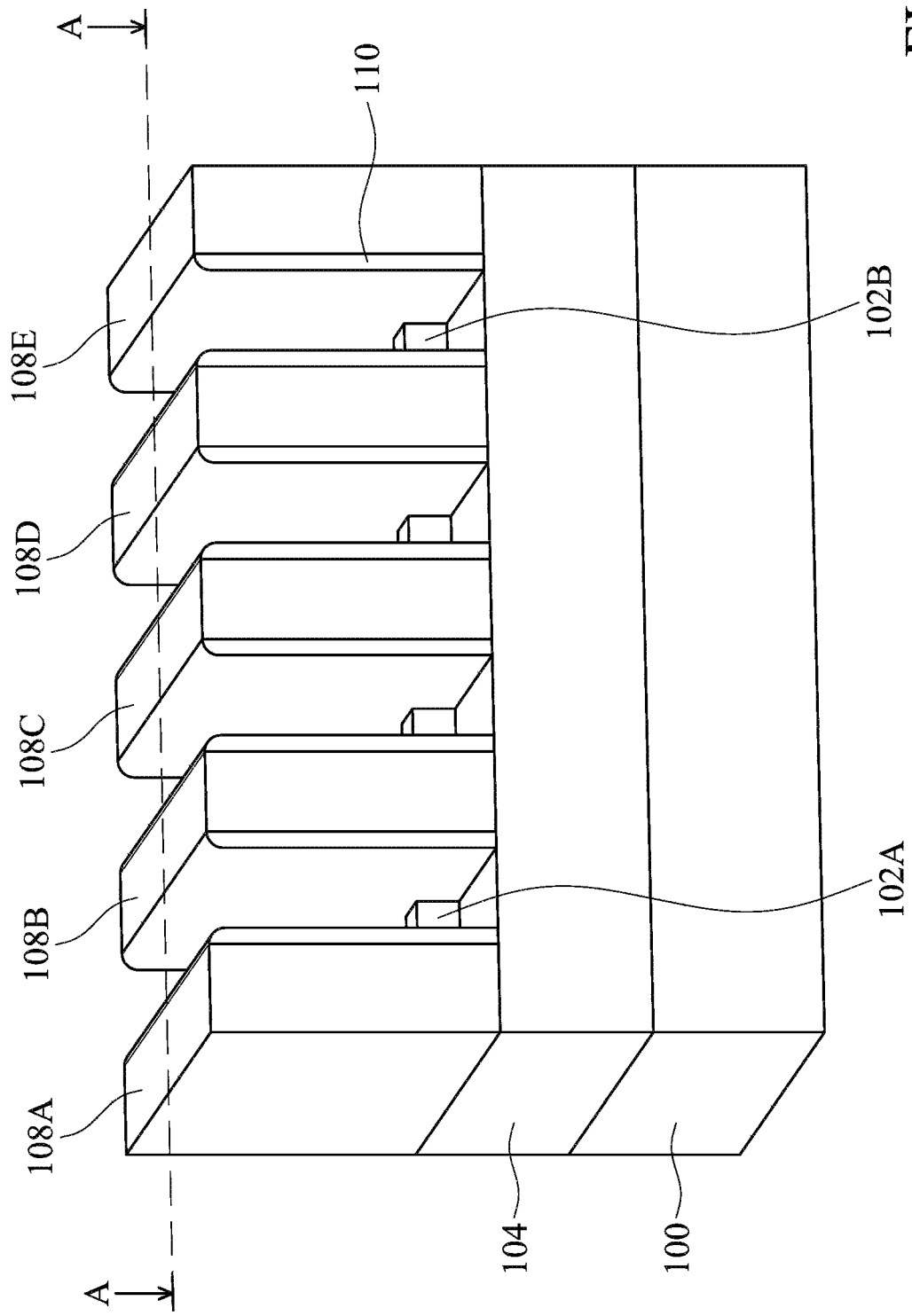

As shown in FIGS. 1E and 2E, spacer elements 110 are formed on sidewalls of the dummy gate stacks 108A, 108B, 108C, 108D and 108E, in accordance with some embodiments. The spacer elements 110 may be used to assist in a subsequent formation of source/drain features. In some embodiments, the spacer elements 110 include one or more layers. In some embodiments, the spacer elements 110 are made of a dielectric material. The dielectric material may include silicon nitride, silicon oxide, silicon oxynitride, silicon carbide, another suitable material, or a combination thereof.

In some embodiments, a spacer material layer is deposited over the dummy gate stacks 108A, 108B, 108C, 108D and 108E using a CVD process, a PVD process, a spin-on process, another applicable process, or a combination thereof. Afterwards, the spacer material layer is partially removed using an etching process, such as an anisotropic etching process. As a result, the remaining portions of the spacer material layer on the sidewalls of the dummy gate stacks 108A, 108B, 108C, 108D and 108E form the spacer elements 110.

Afterwards, as shown in FIGS. 1E and 2E, source/drain features including source/drain features 112 are formed in the fin structures 102A and 102B, as shown in FIG. 1B in accordance with some embodiments. As shown in FIGS. 1E and 2E, two source/drain features 112 are formed in the fin structure 102A, in accordance with some embodiments. In some embodiments of the present disclosure, one of the two source/drain features 112 is formed between the dummy gate stacks 108A and 108B, and another one of the two source/drain features 112 is formed between the dummy gate stacks 108B and 108C.

As shown in FIGS. 1E and 2E, another two source/drain features 112 are formed in the fin structure 102B, in accordance with some embodiments. In some embodiments of the present disclosure, one of the two source/drain features 112 is formed between the dummy gate stacks 108C and 108D, and another one of the two source/drain features 112 is formed between the dummy gate stacks 108D and 108E In some embodiments of the present disclosure, the source/drain features 112 may be formed by ion implantation. For example, in some embodiments of the present disclosure, when the source/drain features 112 are N-type doped regions, the predetermined region for the source/drain features 112 may be implanted with phosphorous ions or arsenic ions to form the source/drain features 112. In some other embodiments, when the source/drain features 112 are P-type doped regions, the predetermined region for the source/drain features 112 may be implanted with boron ion, indium ion or boron difluoride ion ($BF_2^+$) to form the source/drain features 112.

In some embodiments of the present disclosure, after the implantation process is performed on the source/drain features 112, an annealing process, such as a rapid thermal process (RTP), may be performed to repair the crystal structure of the silicon in the source/drain features 112 and activate the dopant in the source/drain features 112.

As shown in FIG. 1E, the source/drain features 112 are covered by the spacer elements 110 but are not covered by the dummy gate stacks 108A, 108B, 108C, 108D and 108E in some embodiments.

However, embodiments of the disclosure have many variations. For example, in some embodiments, the source/drain features 112 are not covered by the spacer elements 110. In some other embodiments, the source/drain features 112 further extend under the dummy gate stacks 108A, 108B, 108C, 108D and 108E and are covered by the dummy gate stacks 108A, 108B, 108C, 108D and 108E.

Figure 1F:
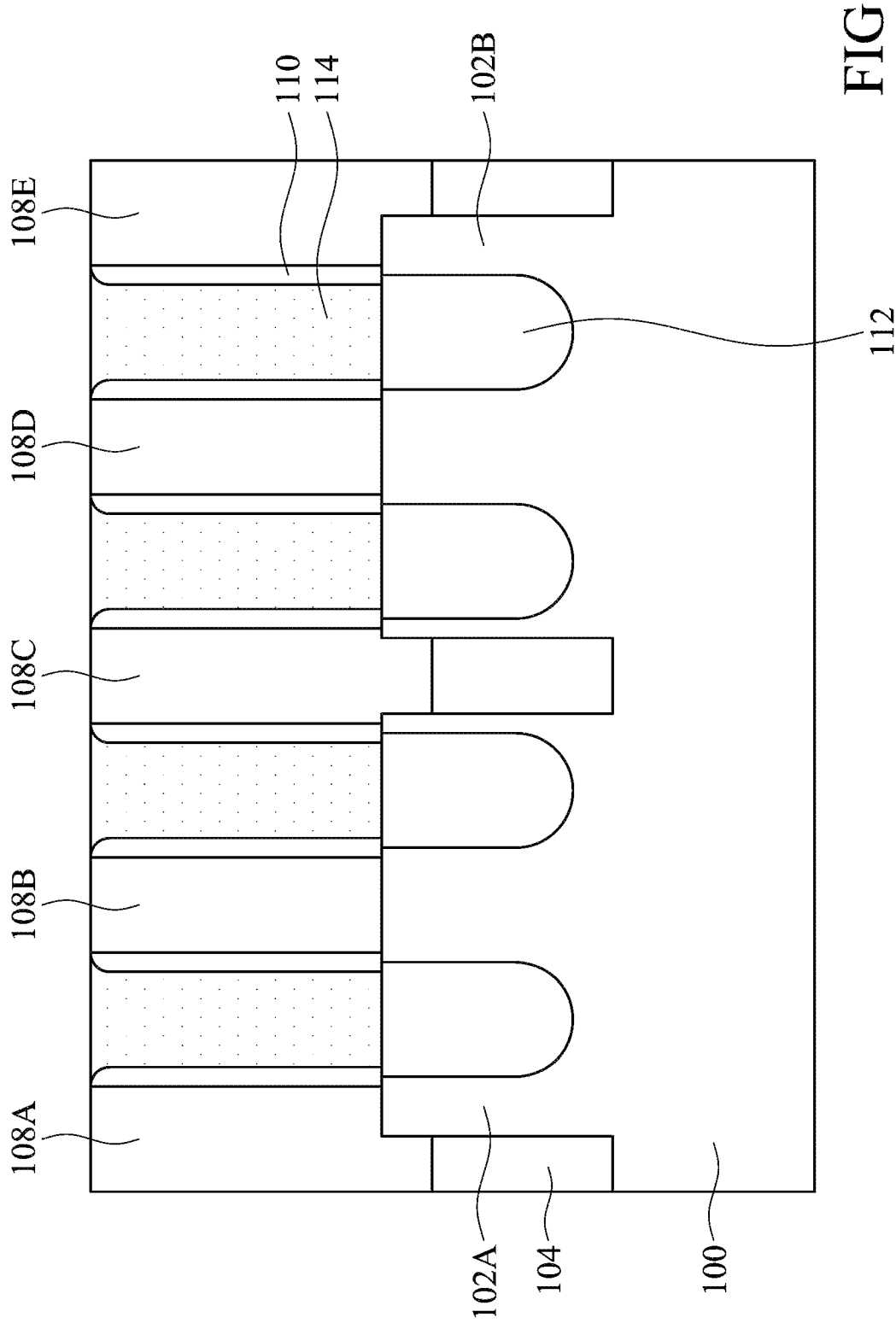
Figure 2F:
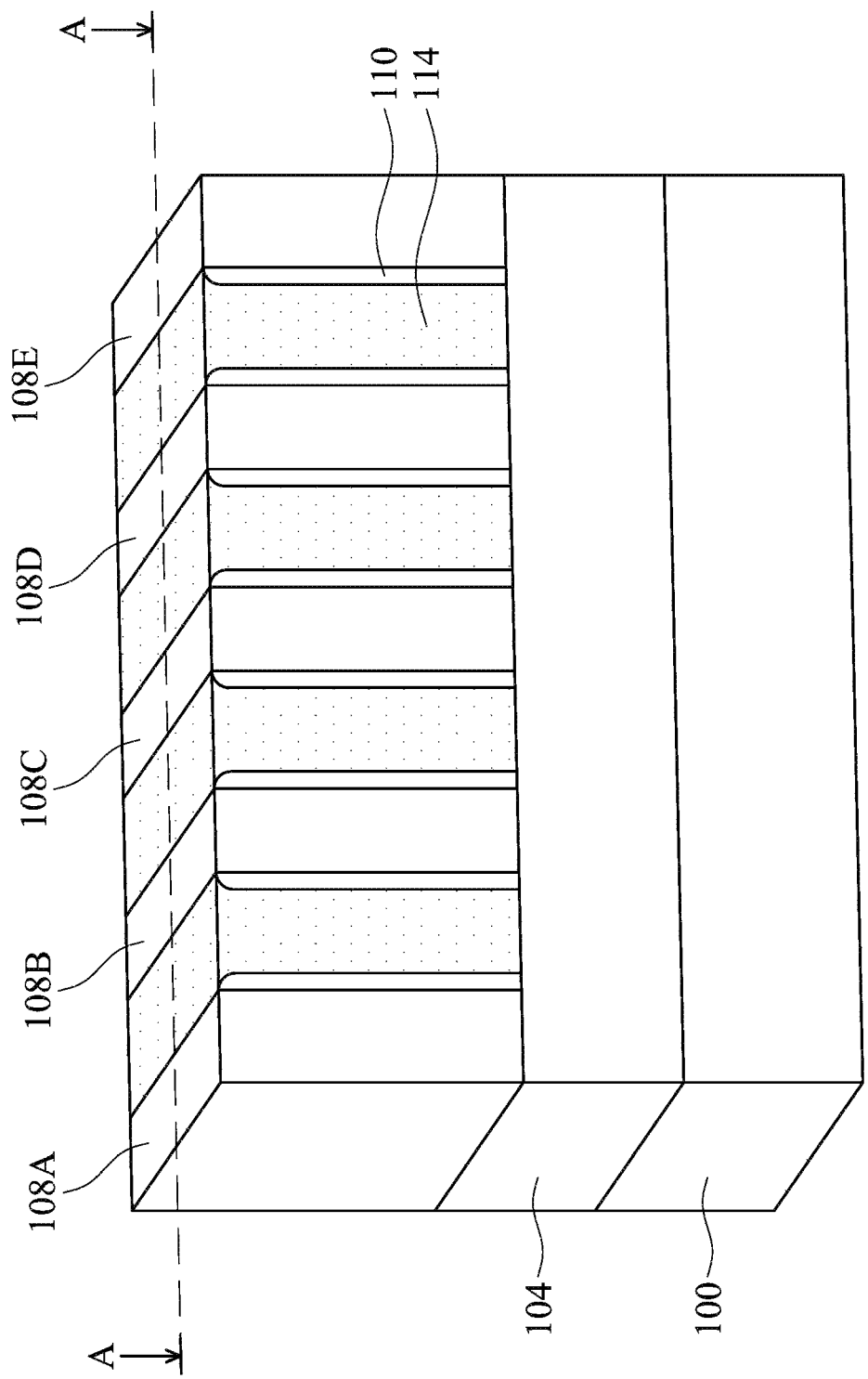

As shown in FIGS. 1F and 2F, a dielectric layer 114 is subsequently formed to surround the dummy gate stacks 108A, 108B, 108C, 108D and 108E, in accordance with some embodiments. In some embodiments, a dielectric material layer is deposited to cover the source/drain features 112 and the dummy gate stacks 108A, 108B, 108C, 108D and 108E. In some embodiments, the dielectric material layer includes silicon oxide, silicon oxynitride, borosilicate glass (BSG), phosphoric silicate glass (PSG), borophosphosilicate glass (BPSG), fluorinated silicate glass (FSG), low-k material, porous dielectric material, another suitable material, or a combination thereof. In some embodiments, the dielectric material layer is deposited using a CVD process, an ALD process, a spin-on process, a spray coating process, another applicable process, or a combination thereof.

Afterwards, a planarization process may be used to partially remove the dielectric material layer. The dielectric material layer may be partially removed until the dummy gate stacks 108A, 108B, 108C, 108D and 108E are exposed. As a result, the dielectric layer 114 is formed. In some embodiments, the planarization process includes a CMP process, a grinding process, a dry polishing process, an etching process, another applicable process, or a combination thereof.

Figure 1G:
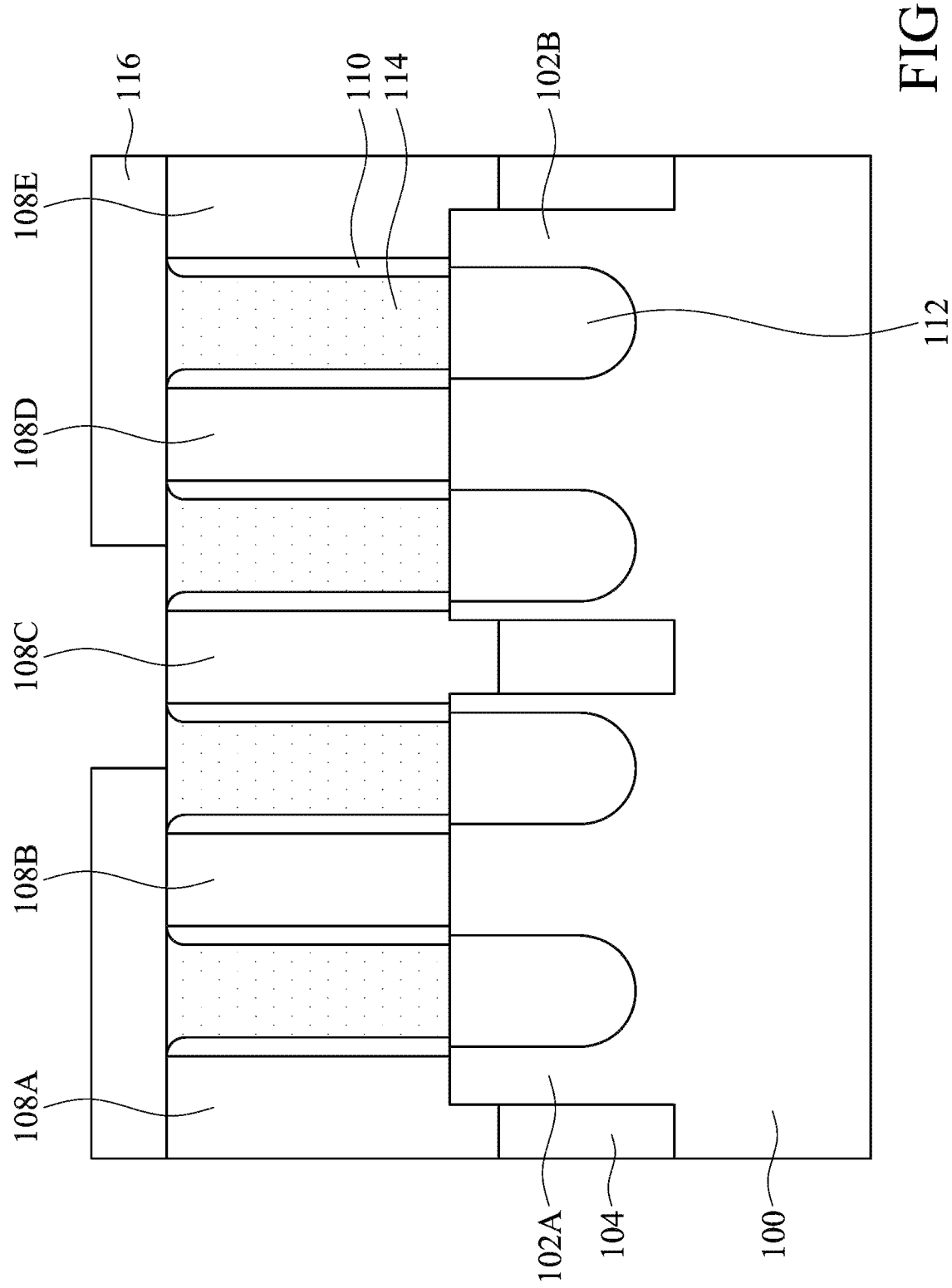
Figure 2G:
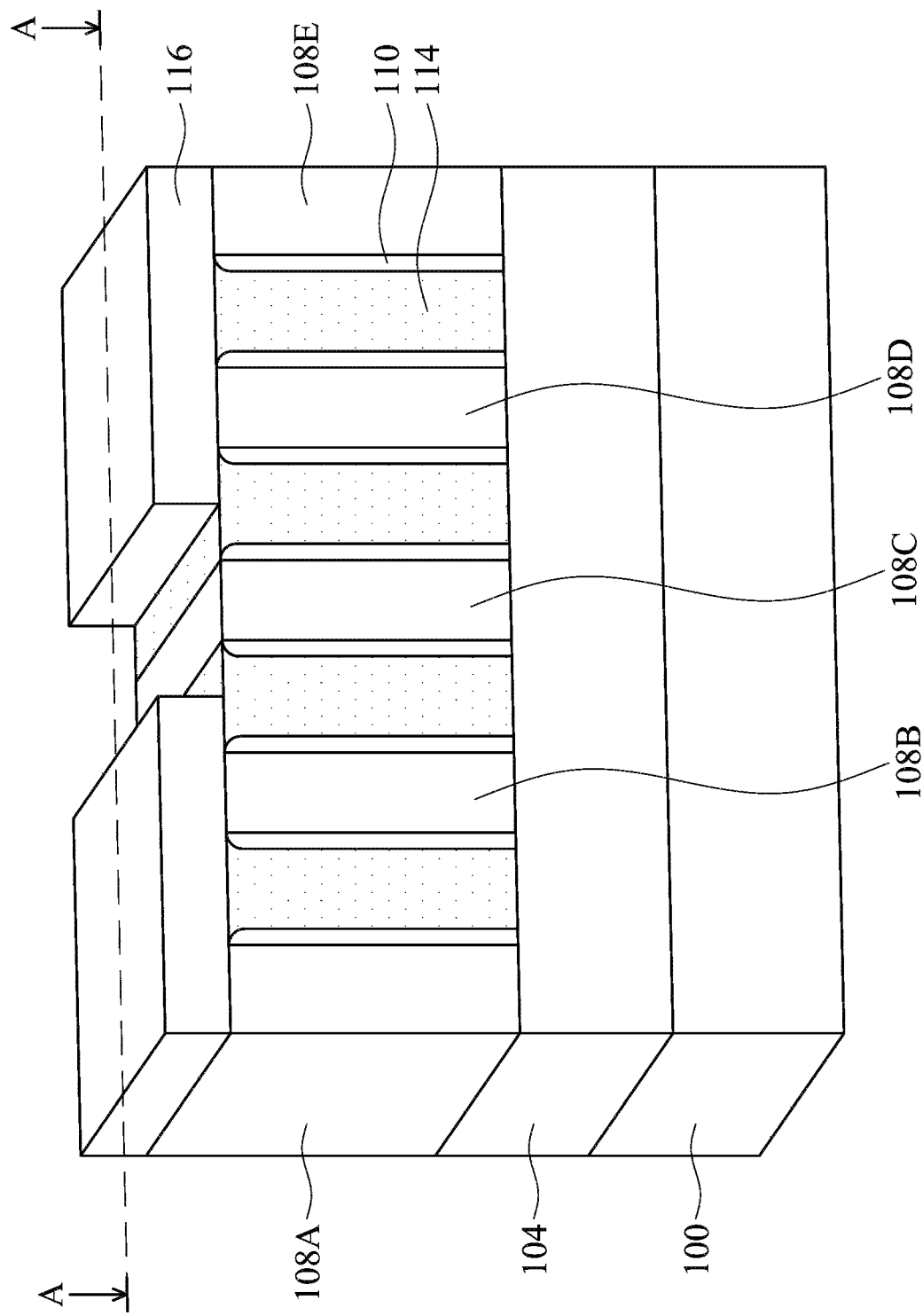

As shown in FIGS. 1G and 2G, a mask layer 116 is formed over the dummy gate stacks 108A, 108B, 108D and 108E and the dielectric layer 114, in accordance with some embodiments. In some embodiments of the present disclosure, the dummy gate stack 108C, which will be partially removed in a subsequent process, is exposed from the mask layer 116, as shown in FIGS. 1G and 2G. In other words, before the partial removal of the dummy gate stack 108C, the dummy gate stacks 108A, 108B, 108D and 108E are blocked.

In some embodiments, the mask layer 116 is made of a dielectric material. The dielectric material may include silicon oxide, silicon nitride, silicon oxynitride, silicon carbide, another suitable dielectric material, or a combination thereof.

In some embodiments, a mask material layer is deposited over the dummy gate stacks 108A, 108B, 108C, 108D and 108E and the dielectric layer 114. The mask material layer may be deposited by using a chemical vapor deposition (CVD) process, a physical vapor deposition (PVD) process, a spin-on process, another applicable process, or a combination thereof. Afterwards, the mask material layer is partially removed by using a photolithography process and an etching process. For example, a patterned photoresist layer (not shown) is formed on the mask material layer. The portion of the mask material layer not covered by the photoresist layer is etched. As a result, the mask layer 116 is formed.

Figure 1H:
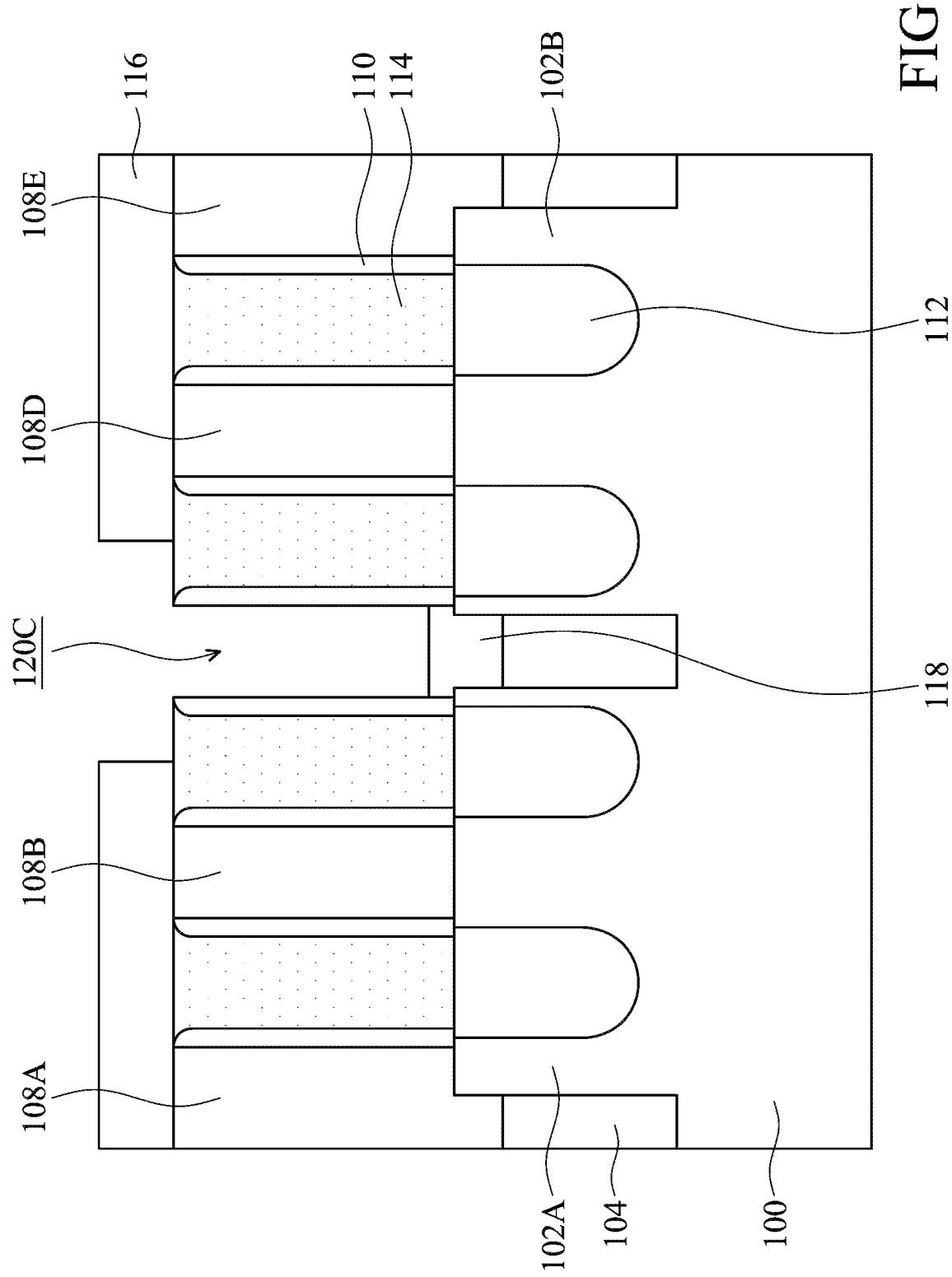
Figure 2H:
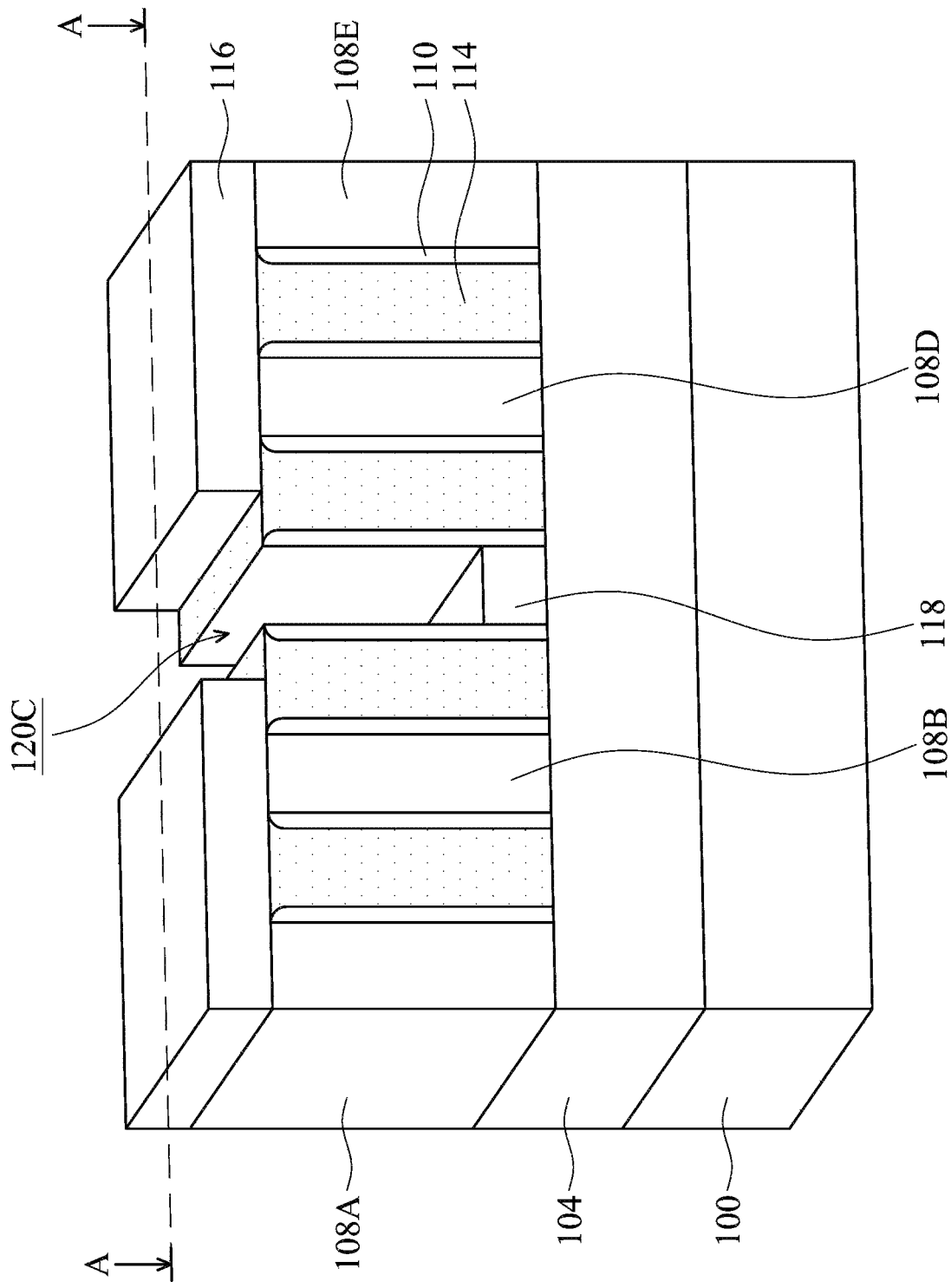

As shown in FIGS. 1H and 2H, the dummy gate stack 108C is partially removed, in accordance with some embodiments. As a result, the remaining portion of the dummy gate stack 108C forms a semiconductor layer 118 over the substrate 100, and the space resulted from partially removing the dummy gate stack 108C forms a recess 120C. In some embodiments, the semiconductor layer 118 is made of polysilicon. In addition, in some embodiments, due to the conductivity possess by the polysilicon, this layer may also be referred to as a conductive layer 118.

In some embodiments, the dummy gate stack 108C is partially removed using a wet etching process. For example, an etching solution containing NH$_4$OH solution, dilute-HF, other suitable etching solution, or a combination thereof may be used. In some embodiments, the dummy gate stack 108C is partially removed using a dry etching process. Example etchants includes fluorine and/or chlorine based etchants.

As shown in FIGS. 1H and 2H, the semiconductor layer 118 is formed over a portion of the fin structure 102A, a portion of the fin structure 102B and over the isolation structure 104 between the fin structures 102A and 102B, in accordance with some embodiments. In addition, as shown in FIGS. 1H and 2H, the top surface of the semiconductor layer 118 is higher than the top surfaces of the fin structures 102A and 102B and lower than the top surface of the dummy gate stacks 108A, 108B, 108D and 108E, in accordance with some embodiments. In some embodiments of the present disclosure, the fin structures 102A and 102B are not exposed during the partial removal of the dummy gate stack 108C.

Figure 1I:
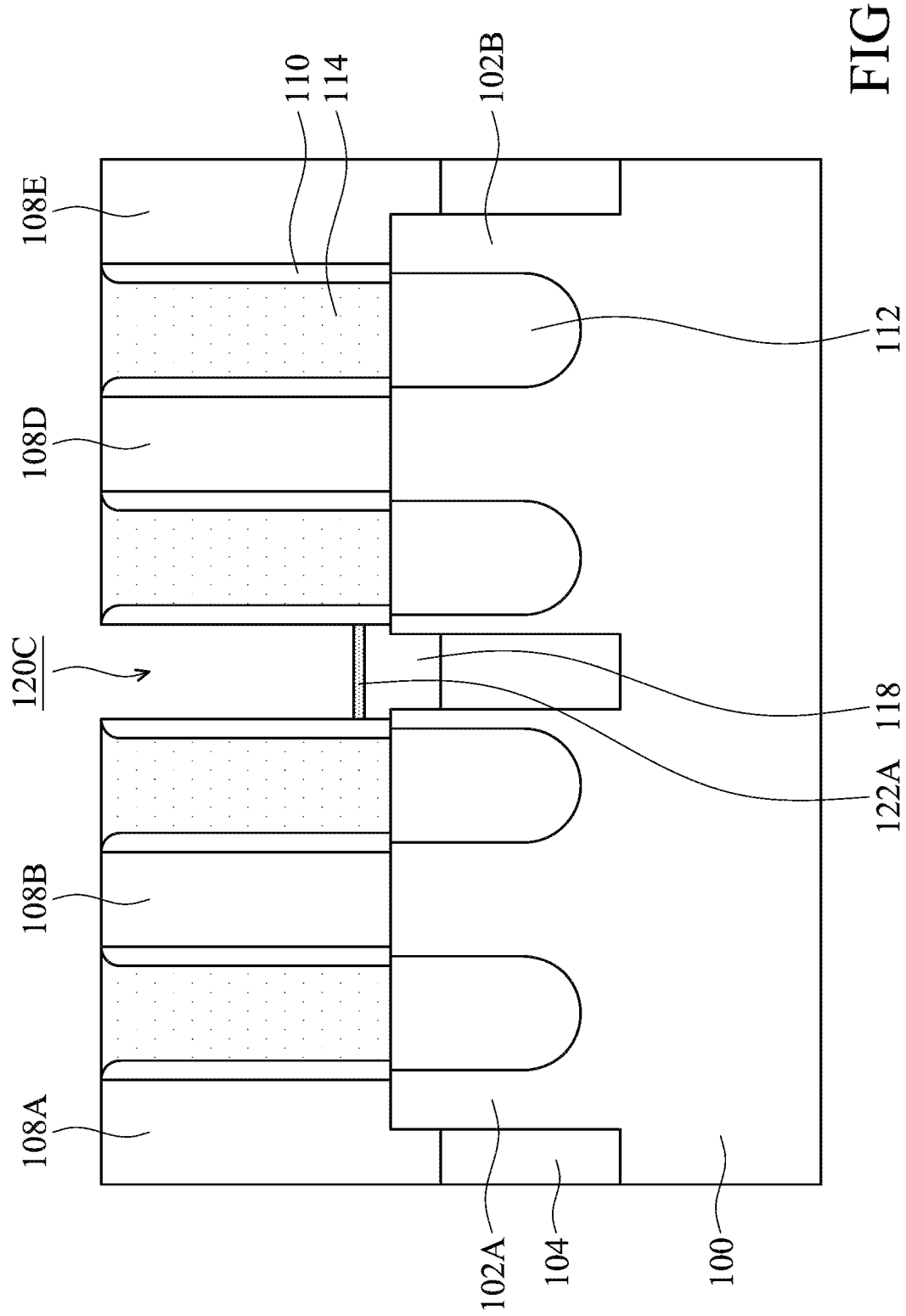
Figure 2I:
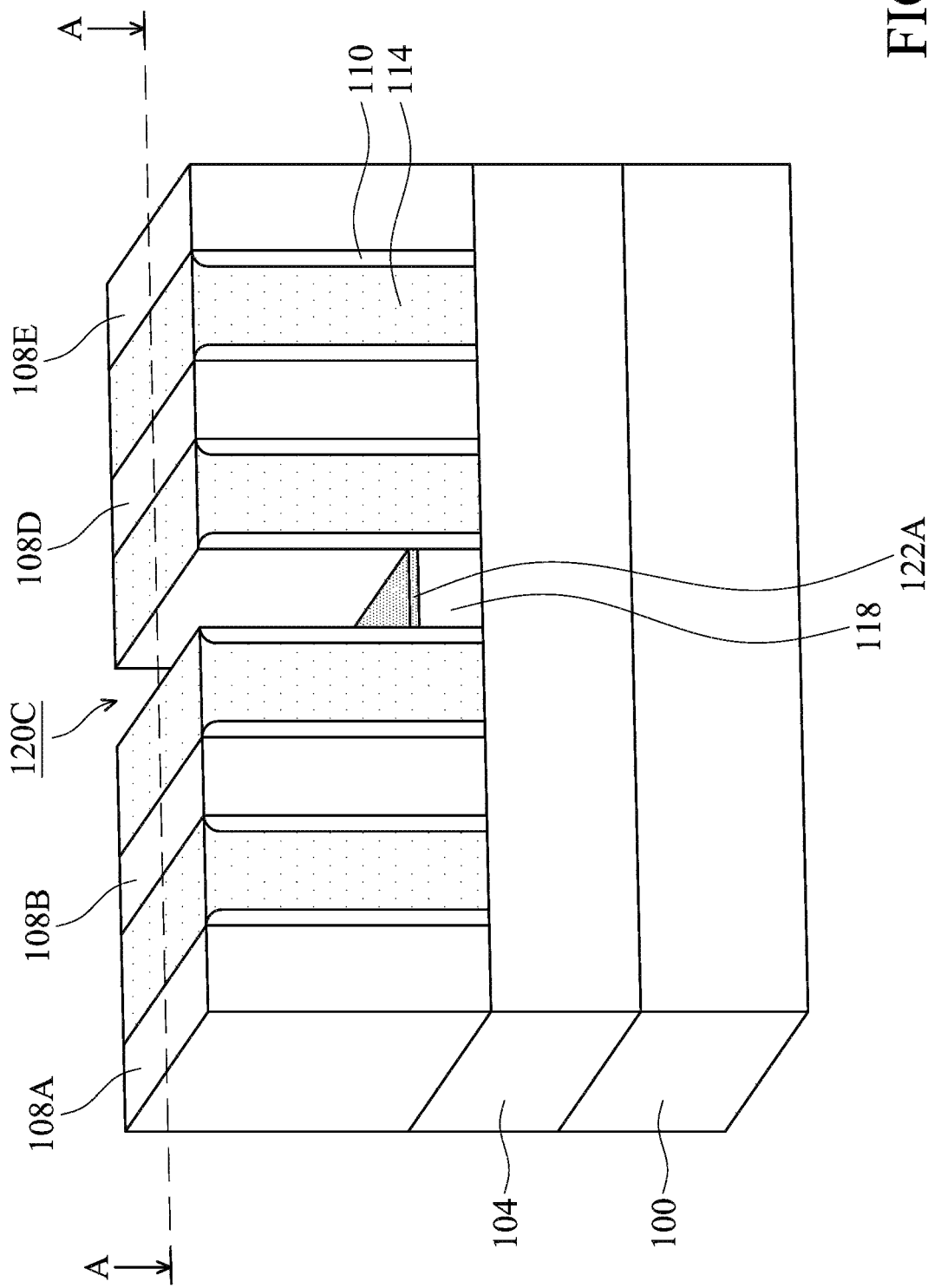

As shown in FIGS. 1I and 2I, after the partial removal of the dummy gate stack 108C, the mask layer 116 is removed and the dummy gate stacks 108A, 108B, 108D and 108E are exposed. In some embodiments, an anisotropic etching process is performed to remove the mask layer 116.

Afterward, a protection layer 122A is deposited over the semiconductor layer 118. Since the semiconductor layer 118 is covered by the protection layer 122A, the semiconductor layer 118 is protected from being negatively affected during subsequent processes performed to the dummy gate stacks 108A, 108B, 108D and 108E.

In some embodiments, the protection layer 122A is made of silicon oxide, silicon nitride, silicon oxynitride, another suitable dielectric material, or a combination thereof. In some embodiments, the protection layer 122A is deposited over the semiconductor layer 118 using a chemical vapor deposition (CVD) process, an atomic layer deposition (ALD) process, a thermal oxidation process, a physical vapor deposition (PVD) process, another applicable process, or a combination thereof. In addition, in some embodiments of the present disclosure, since the protection layer 122A is made of a dielectric material, the protection layer 122A is also referred to as a dielectric layer.

As shown in FIGS. 1J, 1K, 2J and 2K, one or more gate replacement processes are subsequently performed to replace the dummy gate stacks 108A, 108B, 108D and/or 108E with other gate stacks, in accordance with some embodiments. In some embodiments, the gate replacement process is a metal gate replacement process and the dummy gate stacks 108A, 108B, 108D and/or 108E are replaced with suitable metal materials. However, embodiments of the disclosure are not limited thereto. In some other embodiments, one or more of the dummy gate stacks 108A, 108B, 108D and 108E are not replaced.

Figure 1J:
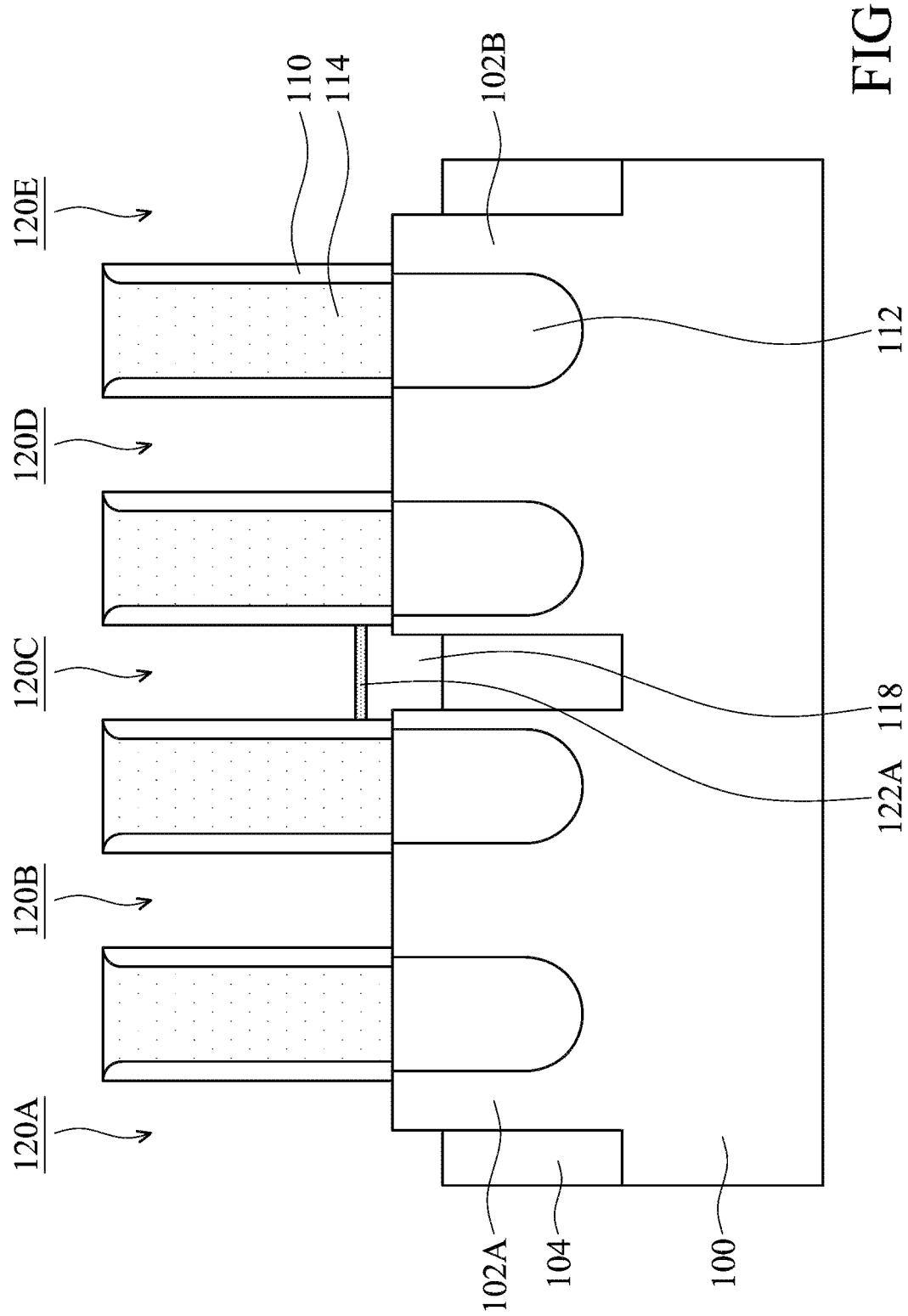
Figure 2J:
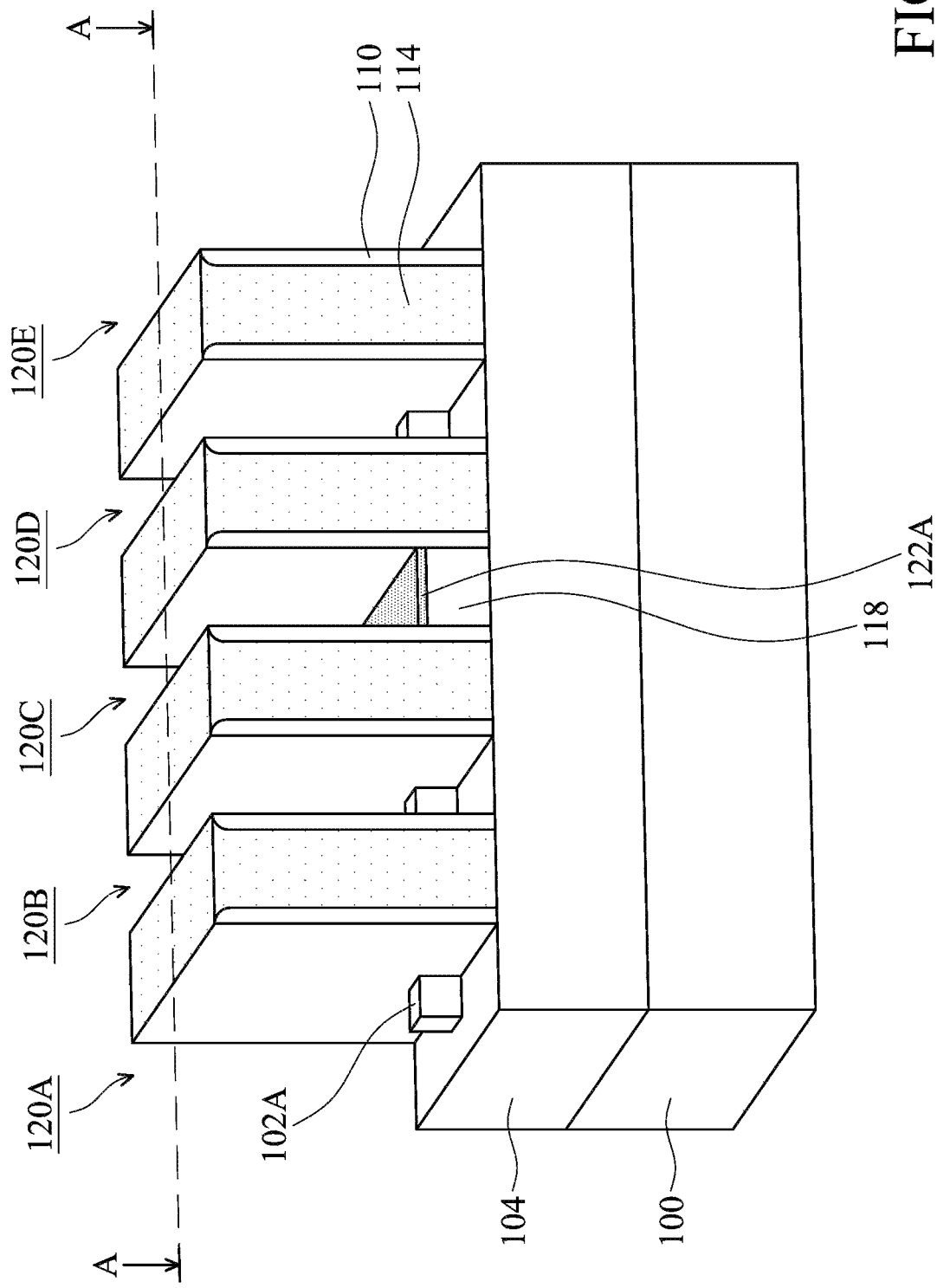

As shown in FIGS. 1J and 2J, after the formation of the protection layer 122A, the dummy gate stacks 108A, 108B, 108D and 108E are removed to form recesses 120A, 120B, 120D and 120E, as shown in FIG. 1C in accordance with some embodiments. The recesses 120A, 120B, 120D and 120E expose the fin structures 102A and 102B. One or more etching processes may be used to form the recesses 120A, 120B, 120D and 120E.

In some embodiments, the dummy gate stacks 108A, 108B, 108D and 108E are removed using a wet etching process. For example, an etching solution containing NH$_4$OH solution, dilute-HF, other suitable etching solution, or a combination thereof may be used. In some embodiments, the dummy gate stacks 108A, 108B, 108D and 108E are removed using a dry etching process. Example etchants includes fluorine and/or chlorine based etchants.

In some cases, during the etching processes for forming the recesses 120A, 120B, 120D and 120E, the semiconductor layer 118 is protected by the protection layer 122A. Therefore, the semiconductor layer 118 will not be removed to expose the portions of the fin structures 102A and 102B under the semiconductor layer 118. Therefore, during the etching processes for forming the recesses 120A, 120B, 120D and 120E, the portions of the fin structures 102A and 102B under the semiconductor layer 118 is protected by the semiconductor layer 118. As a result, the flatness of the fin structures 102A and 102B may be kept, such that the structural reliability of the contacts subsequently formed over the fin structures 102A and 102B is improved.

In addition, in some cases, since the dummy gate stack 108C is previously removed, the number of dummy gate stacks being etched in the etching processes is decreased. Accordingly, the etch loading of the etching processes is reduced, which in turn improves the yield.

Figure 1K:
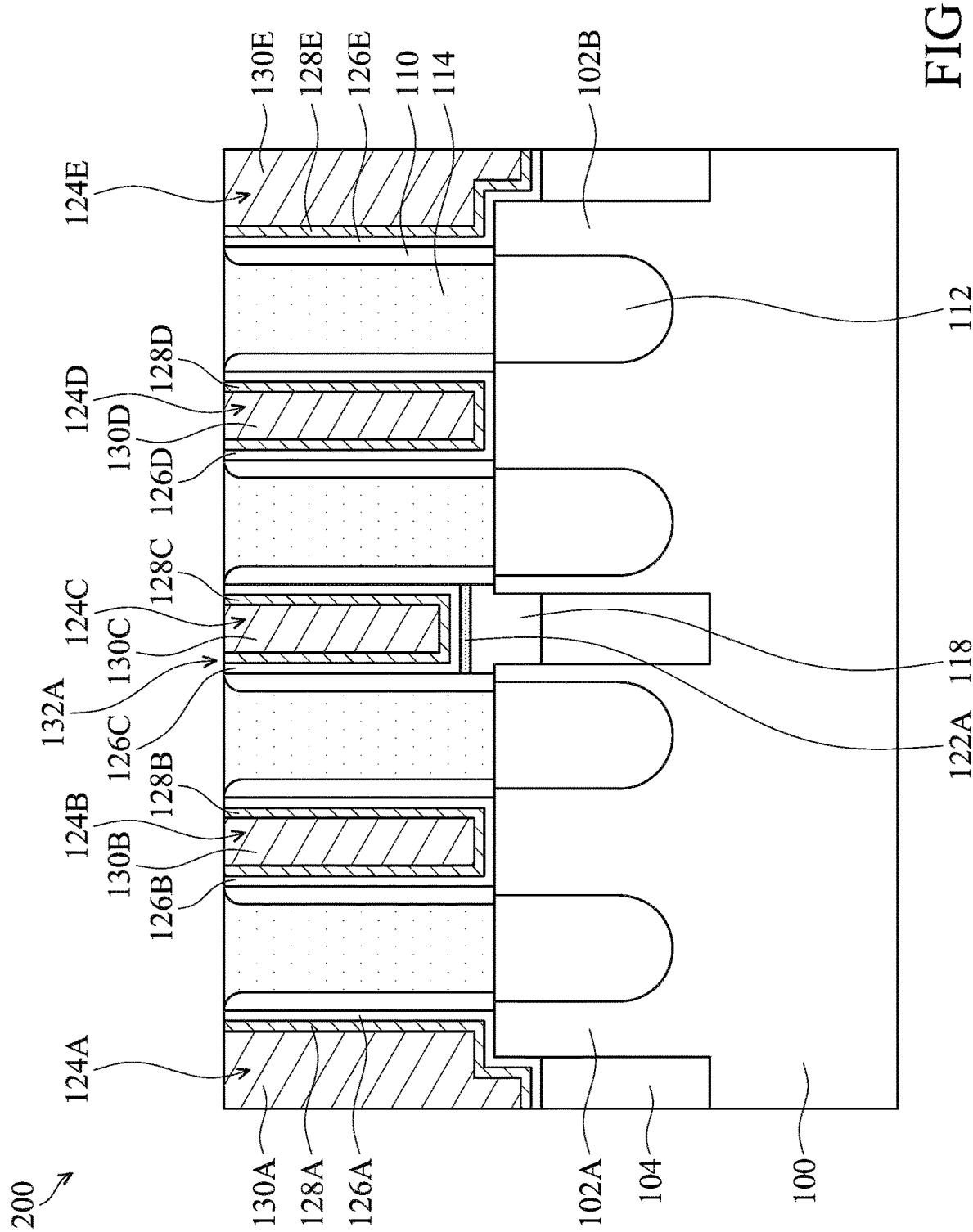
Figure 2K:
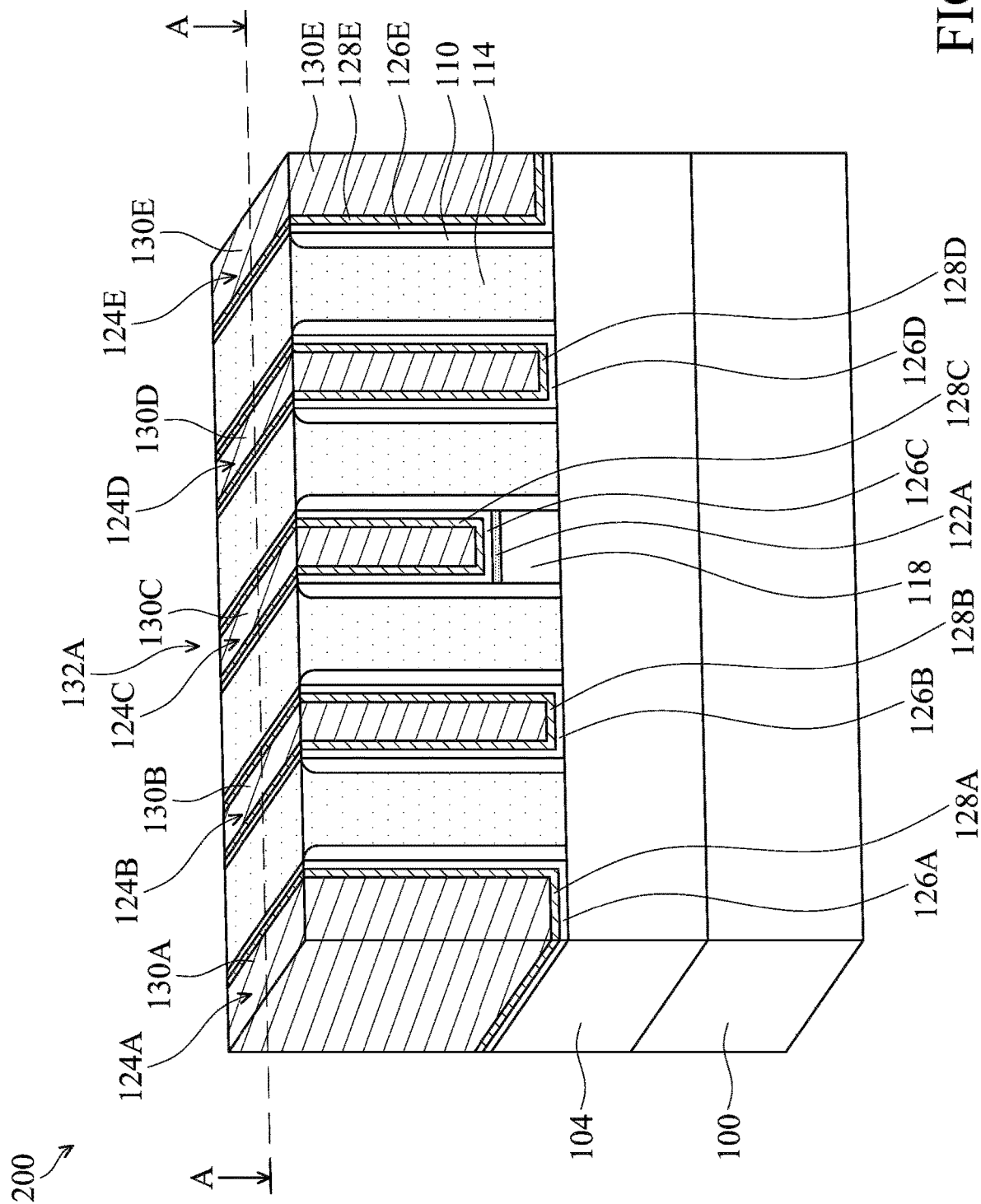

As shown in FIGS. 1K and 2K, gate stacks 124A, 124B, 124C, 124D and 124E are respectively formed in the recesses 120A, 120B, 120C, 120D and 120E to form a semiconductor device 200, in accordance with some embodiments. In some embodiments of the present disclosure, the gate stacks 124A, 124B, 124C, 124D and 124E are metal gate stacks.

As shown in FIGS. 1K and 2K, the gate stack 124A is positioned at an end of the fin structure 102A. In some embodiments of the present disclosure, the gate stack 124A covers a portion of the top surface and a portion of the sidewall of the fin structure 102A, as shown in FIGS. 1K and 2K.

In some embodiments of the present disclosure, the gate stack 124A includes a gate dielectric layer 126A, a work function layer 128A, and a conductive filling layer 130A, in accordance with some embodiments. In some embodiments, the gate dielectric layer 126A is conformally deposited in the recess 120A, the work function layer 128A is conformally deposited over the gate dielectric layer 126A, and the conductive filling layer 130A is deposited over the work function layer 128A.

The work function layer 128A and the conductive filling layer 130A together form a conductive layer. In some embodiments of the present disclosure, the conductive layer is a metal electrode. In addition, in some embodiments of the present disclosure, the gate stack 124A serves as a dummy gate stack.

As shown in FIGS. 1K and 2K, the gate stack 124B is formed over the fin structure 102A and partially covers the fin structure 102A. In addition, in some embodiments of the present disclosure, the gate stack 124B traverses over the fin structure 102A, as shown in FIGS. 1K and 2K.

In some embodiments of the present disclosure, the gate stack 124B includes a gate dielectric layer 126B, a work function layer 128B, and a conductive filling layer 130B, in accordance with some embodiments. In some embodiments, the gate dielectric layer 126B is conformally deposited in the recess 120B, the work function layer 128B is conformally deposited over the gate dielectric layer 126B, and the conductive filling layer 130B is deposited over the work function layer 128B. The work function layer 128B and the conductive filling layer 130B together form a conductive layer. In some embodiments of the present disclosure, the conductive layer is a metal electrode.

In addition, as shown in FIGS. 1K and 2K, the gate stack 124C is formed in the recess 120C and formed over the protection layer 122A. In some embodiments of the present disclosure, the gate stack 124C includes a gate dielectric layer 126C, a work function layer 128C, and a conductive filling layer 130C, in accordance with some embodiments. In some embodiments, the gate dielectric layer 126C is conformally deposited in the recess 120C, the work function layer 128C is conformally deposited over the gate dielectric layer 126C, and the conductive filling layer 130C is deposited over the work function layer 128C.

The work function layer 128C and the conductive filling layer 130C together form a conductive layer over the protection layer 122A and the semiconductor layer 118. In some embodiments of the present disclosure, the conductive layer is a metal electrode. In some embodiments, the gate dielectric layer 126C is between the conductive layer and the protection layer 122A. In addition, in some embodiments of the present disclosure, the gate stack 124C serves as a dummy gate stack.

As shown in FIGS. 1K and 2K, the semiconductor layer 118, the protection layer 122A, the gate dielectric layer 126C, the work function layer 128C and the conductive filling layer 130C together form a stack structure 132A over the substrate 100. As shown in FIGS. 1K and 2K, the stack structure 132A is formed between the gate stacks 124B and 124D, in accordance with some embodiments. In some embodiments of the present disclosure, the stack structure 132A is formed over a portion of the fin structure 102A, a portion of the fin structure 102B and over the isolation structure 104 between the fin structures 102A and 102B.

As shown in FIGS. 1K and 2K, the gate stack 124D is formed over the fin structure 102B and partially covers the fin structure 102B. In addition, in some embodiments of the present disclosure, the gate stack 124D traverses over the fin structure 102B, as shown in FIG. 2K.

In some embodiments of the present disclosure, the gate stack 124D includes a gate dielectric layer 126D, a work function layer 128D, and a conductive filling layer 130D, in accordance with some embodiments. In some embodiments, the gate dielectric layer 126D is conformally deposited in the recess 120D, the work function layer 128D is conformally deposited over the gate dielectric layer 126D, and the conductive filling layer 130D is deposited over the work function layer 128D. The work function layer 128D and the conductive filling layer 130D together form a conductive layer. In some embodiments of the present disclosure, the conductive layer is a metal electrode.

As shown in FIGS. 1K and 2K, the gate stack 124E is positioned at an end of the fin structure 102B. In some embodiments of the present disclosure, the gate stack 124E covers a portion of the top surface and a portion of the sidewall of the fin structure 102B, as shown in FIGS. 1K and 2K.

In some embodiments of the present disclosure, the gate stack 124E includes a gate dielectric layer 126E, a work function layer 128E, and a conductive filling layer 130E, in accordance with some embodiments. In some embodiments, the gate dielectric layer 126E is conformally deposited in the recess 120E, the work function layer 128E is conformally deposited over the gate dielectric layer 126E, and the conductive filling layer 130E is deposited over the work function layer 128E.

The work function layer 128E and the conductive filling layer 130E together form a conductive layer. In some embodiments of the present disclosure, the conductive layer is a metal electrode. In addition, in some embodiments of the present disclosure, the gate stack 124E serves as a dummy gate stack.

In some embodiments, the materials of the gate dielectric layers 126A, 126B, 126C, 126D and 126E are the same. In some embodiments, the gate dielectric layers 126A, 126B, 126C, 126D and 126E are made of a high-K dielectric material. The high-K dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof.

The work function layers 128A, 128B, 128C, 128D and 128E are used to provide the desired work function for transistors to enhance device performance. In some embodiments, the work function layers 128A, 128B, 128C, 128D and/or 128E are n-type metal layers capable of providing a work function value suitable for the device, such as equal to or less than about 4.5 eV. In some embodiments, the work function layers 128A, 128B, 128C, 128D and/or 128E are p-type metal layers capable of providing a work function value suitable for the device, such as equal to or greater than about 4.8 eV.

In some embodiments, the work function layers 128A, 128B, 128C, 128D and 128E are metal layers with same type, such as the n-type metal layer. In some other embodiments, one or more of the work function layers 128A, 128B, 128C, 128D and 128E are metal layers with a type different from that of the others of the work function layers 128A, 128B, 128C, 128D and 128E. For example, in some embodiments of the present disclosure, the work function layers 128A, 128B and 128C are n-type metal layers, whereas the work function layers 128D and 128E are p-type metal layers.

The n-type metal layer may include metal, metal carbide, metal nitride, or a combination thereof. For example, the n-type metal layer includes titanium nitride, tantalum, tantalum nitride, other suitable materials, or a combination thereof. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The thickness and/or the compositions of the work function layers 128A, 128B, 128C, 128D and 128E may be fine-tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is formed between the gate dielectric layer and the work function layer. The barrier layer may be made of titanium nitride, tantalum nitride, another suitable material, or a combination thereof. In some embodiments, a blocking layer (not shown) is formed over the work function layer before the formation of the conductive filling layers 130A, 130B, 130C, 130D and/or 130E. The blocking layer may be made of tantalum nitride, titanium nitride, another suitable material, or a combination thereof.

In some embodiments, the materials of the conductive filling layers 130A, 130B, 130C, 130D and/or 130E are the same. In some embodiments, the conductive filling layers 130A, 130B, 130C, 130D and/or 130E are made of aluminum, tungsten, titanium, gold, another suitable material, or a combination thereof.

In some embodiments, multiple layers are deposited over the dielectric layer 114 to fill the recesses 120A, 120B, 120C, 120D and 120E. Afterwards, a planarization process is performed to remove the portions of these layers outside of the recesses 120A, 120B, 120C, 120D and 120E. The remaining portions of these layers in the recesses 120A, 120B, 120C, 120D and 120E form the gate stacks 124A, 124B, 124C, 124D and 124E, respectively. Therefore, in some embodiments of the present disclosure, the gate dielectric layer 126C and the conductive layer including the work function layer 128C and the conductive filling layer 130C are formed over the substrate 100 during the replacement of the dummy gate stacks 108A, 108B, 108D and 108E with the gate stacks 124A, 124B, 124D and 124E.

In some embodiments, the top surfaces of the gate stacks 124A, 124B, 124C, 124D and 124E are substantially coplanar with the top surface of the dielectric layer 114 after the planarization process. In some embodiments, the top surfaces of the gate stacks 124A, 124B, 124D and 124E are substantially coplanar with the top surface of the stack structure 132A.

As shown in FIGS. 1K and 2K, the top surface of the semiconductor layer 118 is higher than the top surface of the fin structures 102A and 102B and lower than the top surfaces of the gate stacks 124A, 124B, 124C, 124D, 124E and dielectric layer 114, in accordance with some embodiments.

In addition, as shown in FIGS. 1K and 2K, the top surface of the conductive layer, which includes the work function layer 128C and the conductive filling layer 130C, is substantially coplanar with the top surfaces of the gate stacks 124A, 124B, 124D and 124E, in accordance with some embodiments. In other words, in some embodiments of the present disclosure, the height of the top surface of the conductive layer of the stack structure 132A is substantially equal to the height of the top surface of the gate stacks 124A, 124B, 124D and 124E. In addition, as shown in FIGS. 1K and 2K, the stack structure 132A is substantially parallel to the gate stacks 124A, 124B, 124D and/or 124E.

It should be noted that the exemplary embodiments set forth in FIGS. 1A-1K and 2A-2K are merely for the purpose of illustration. In addition to the embodiments set forth in FIGS. 1A-1K and 2A-2K, the stack structure and the protection layer of it could have other configuration as shown in FIGS. 3A-6B. This will be described in detail in the following description. Therefore, the inventive concept and scope are not limited to the exemplary embodiments shown in FIGS. 1A-1K and 2A-2K.

Figure 3A:
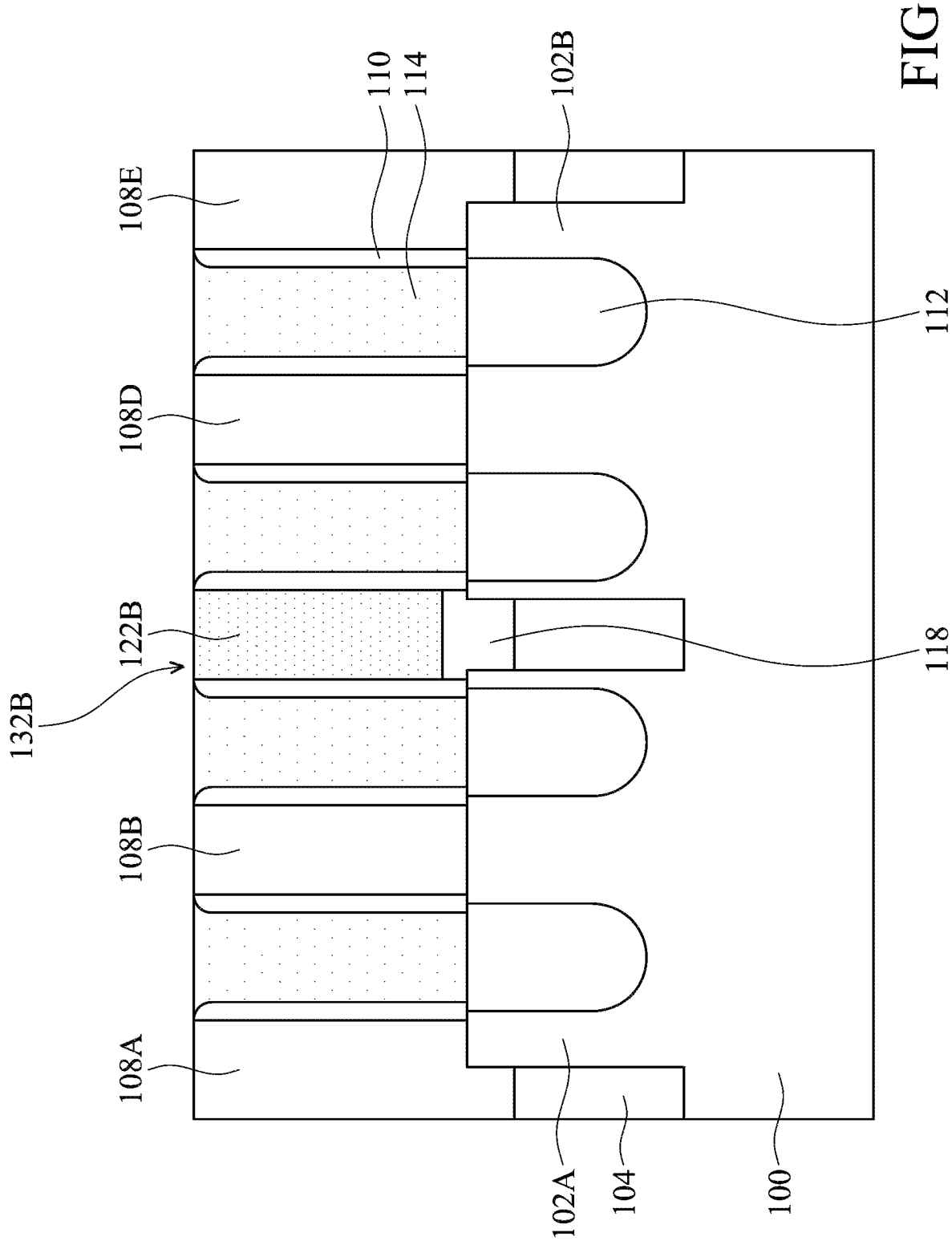
FIGS. 3A-3B are cross-sectional views of various stages of a process for forming a semiconductor device, in accordance with some embodiments.
Figure 3B:
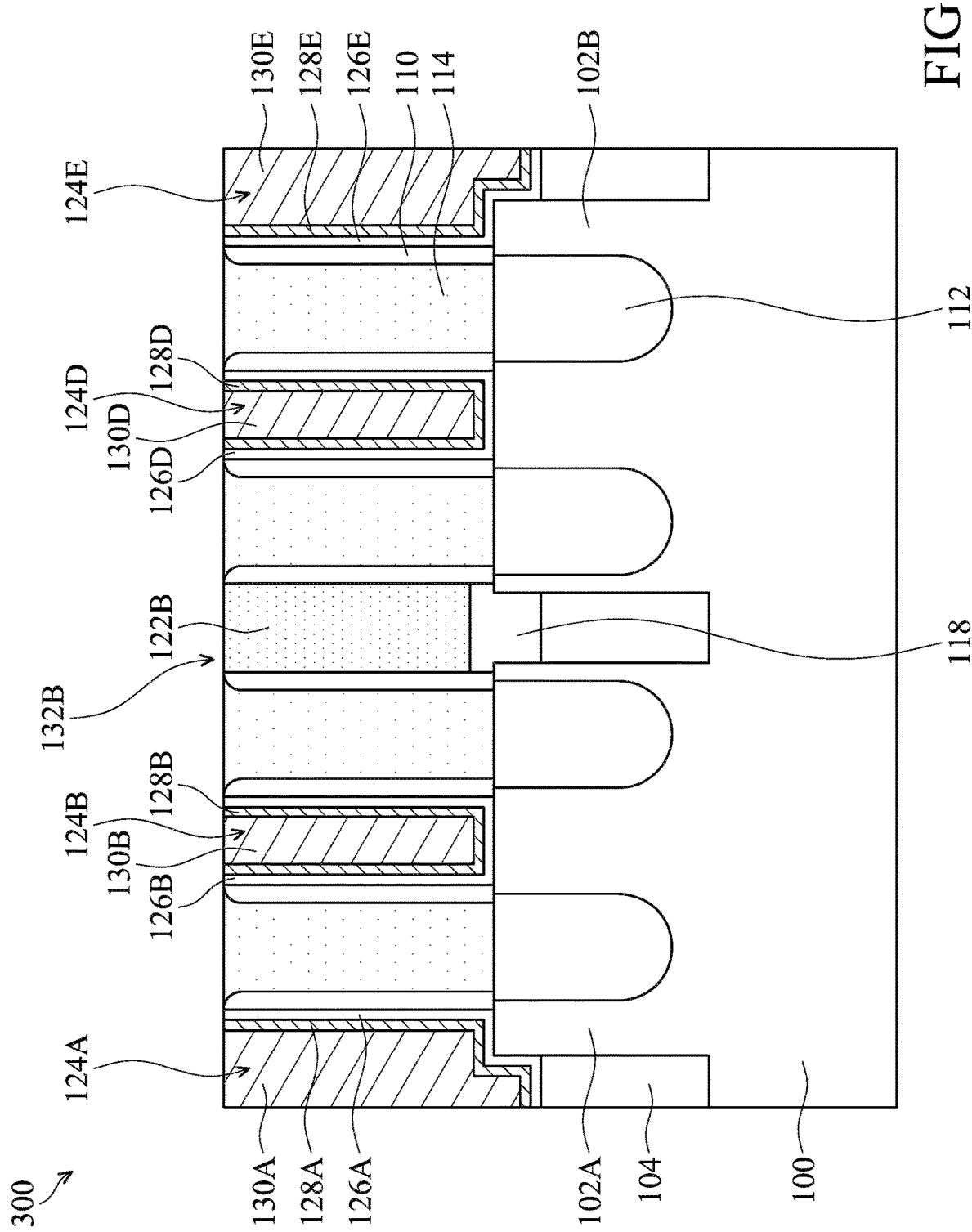
Figure 4A:
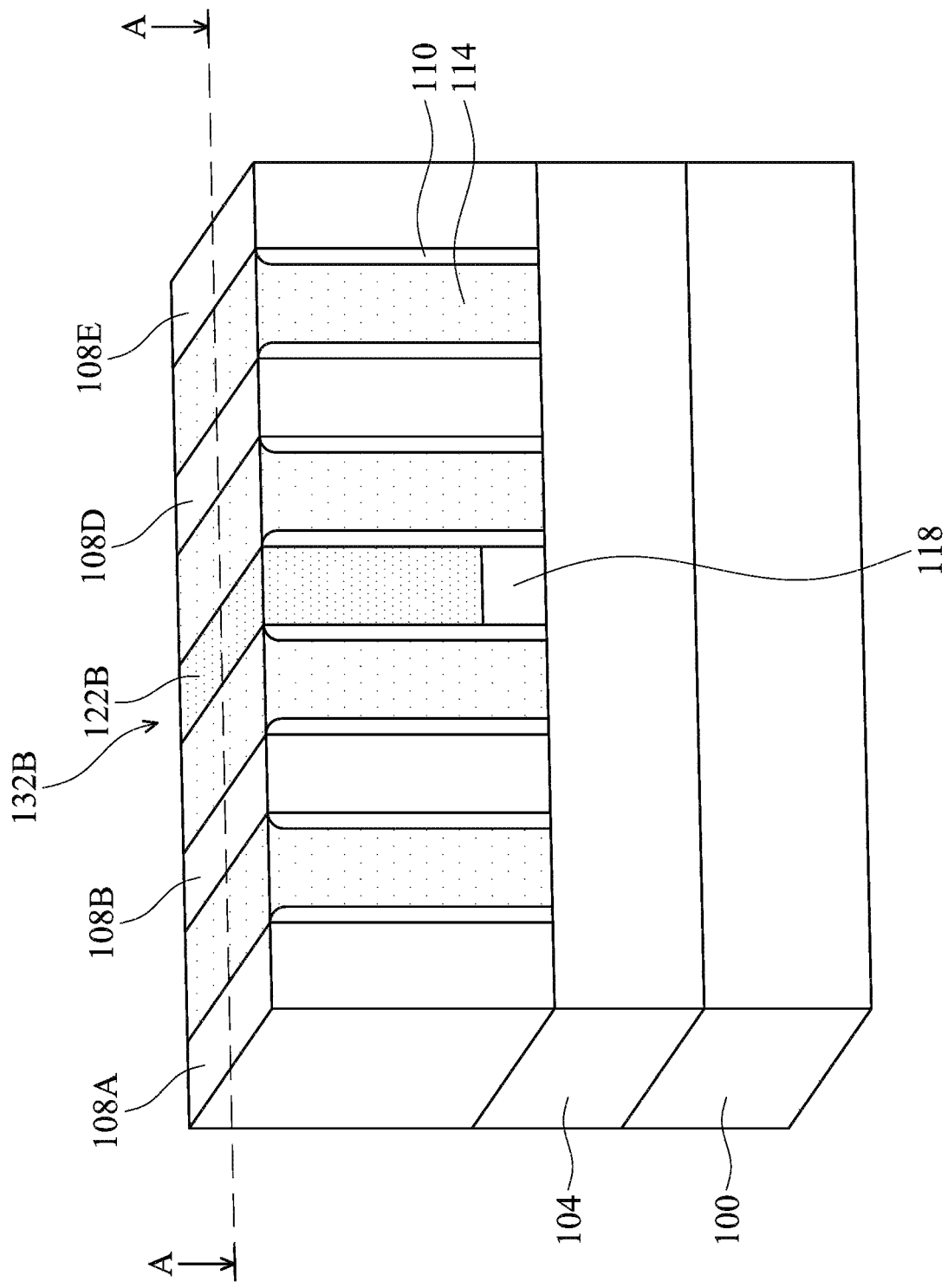
FIGS. 4A-4B are perspective views of various stages of a process for forming a semiconductor device, in accordance with some embodiments.
Figure 4B:
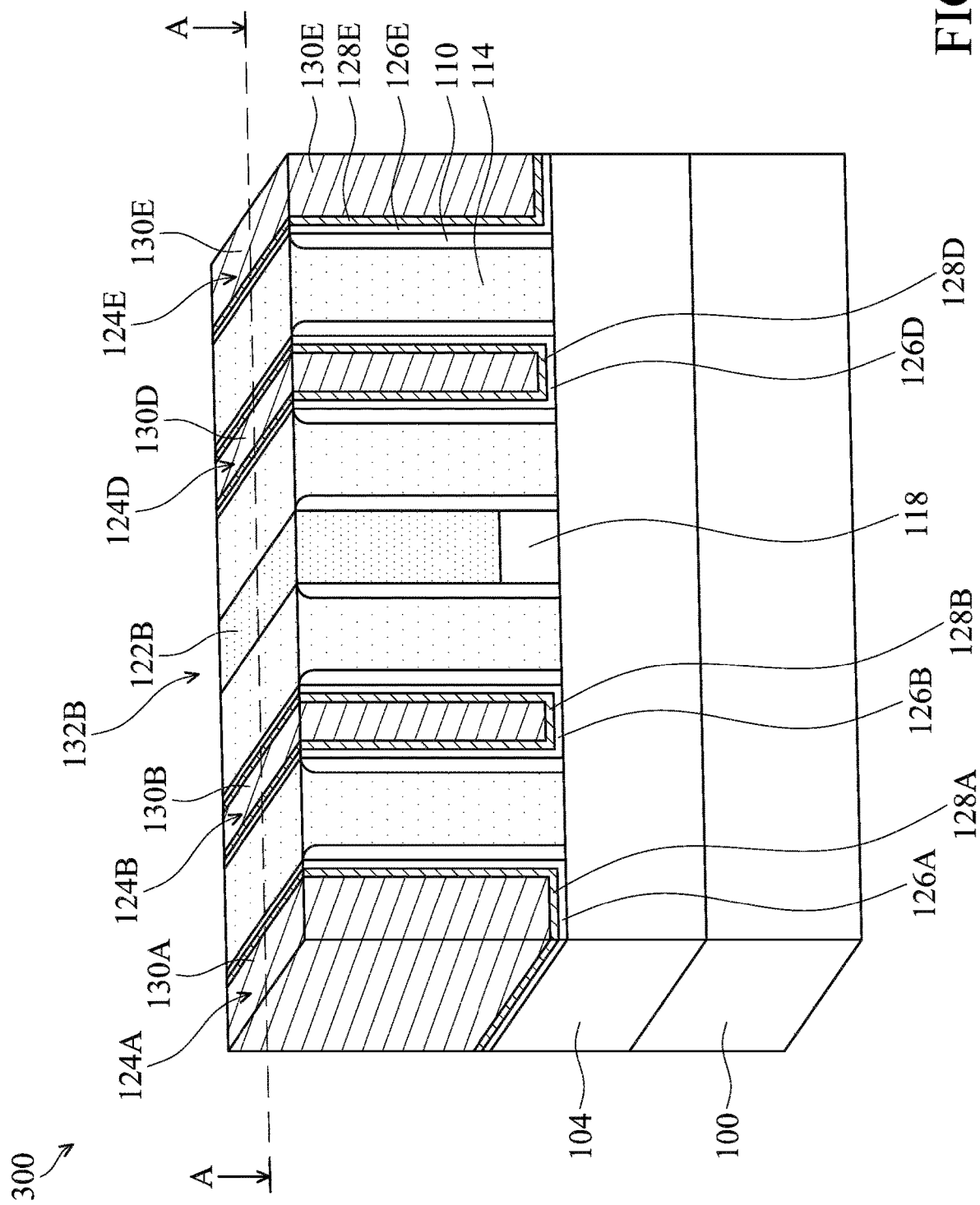

FIGS. 3A-3B are cross-sectional views of various stages of a process for forming a semiconductor device, in accordance with some embodiments. FIGS. 4A-4B are perspective views of various stages of a process for forming a semiconductor device, in accordance with some embodiments. For example, FIGS. 3A-3B are cross-sectional views taken along line A-A in FIGS. 4A-4B. Note that the same or similar elements or layers corresponding to those of the semiconductor device are denoted by like reference numerals. The same or similar elements or layers denoted by like reference numerals have the same meaning and will not be repeated for the sake of brevity.

As shown in FIGS. 3A-4A, after the removal of the mask layer 116 shown in FIG. 1H, a protection layer 122B is deposited over the semiconductor layer 118 to fill the recess 120C, in accordance with some embodiments. In addition, the protection layer 122B and the semiconductor layer 118 together form a stack structure 132B over the substrate 100, as shown in FIGS. 3A-4A.

In some embodiments, after the removal of the mask layer 116, a dielectric material layer is deposited over the dummy gate stacks 108A, 108B, 108D, 108E and the dielectric layer 114 and fill the recess 120C. In some embodiments of the present disclosure, the dielectric material layer is deposited using a CVD process, an ALD process, a spin-on process, a spray coating process, another applicable process, or a combination thereof.

Afterwards, a planarization process may be used to partially remove the dielectric material layer. The dielectric material layer may be partially removed until the dummy gate stacks 108A, 108B, 108D and 108E and the dielectric layer 114 are exposed. As a result, the protection layer 122B is formed. In some embodiments, the planarization process includes a CMP process, a grinding process, a dry polishing process, an etching process, another applicable process, or a combination thereof. In addition, in some embodiments of the present disclosure, since the protection layer 122B is made of a dielectric material, the protection layer 122B is also referred to as a dielectric layer.

As shown in FIGS. 3B and 4B, one or more gate replacement processes are subsequently performed to replace the dummy gate stacks 108A, 108B, 108D and/or 108E with gate stacks 124A, 124B, 124D and 124E to form a semiconductor device 300, in accordance with some embodiments.

As shown in FIGS. 3B and 4B, the top surface of the protection layer 122B is substantially coplanar with the top surfaces of the gate stacks 124A, 124B, 124D and 124E, in accordance with some embodiments. In other words, in some embodiments of the present disclosure, the height of the top surface of the protection layer 122B is substantially equal to the height of the top surfaces of the gate stacks 124A, 124B, 124D and 124E.

Figure 5A:
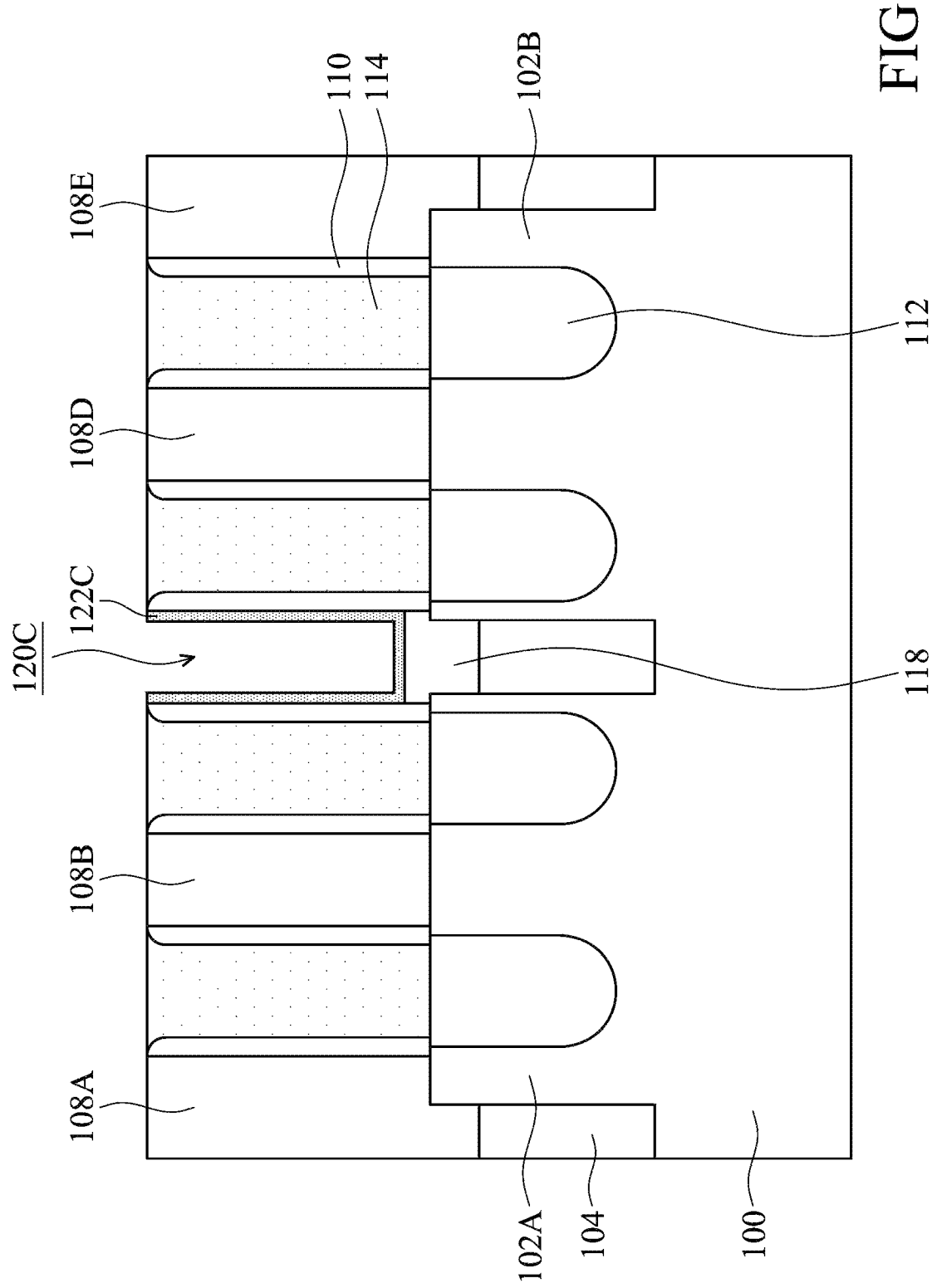
FIGS. 5A-5B are cross-sectional views of various stages of a process for forming a semiconductor device, in accordance with some embodiments.
Figure 5B:
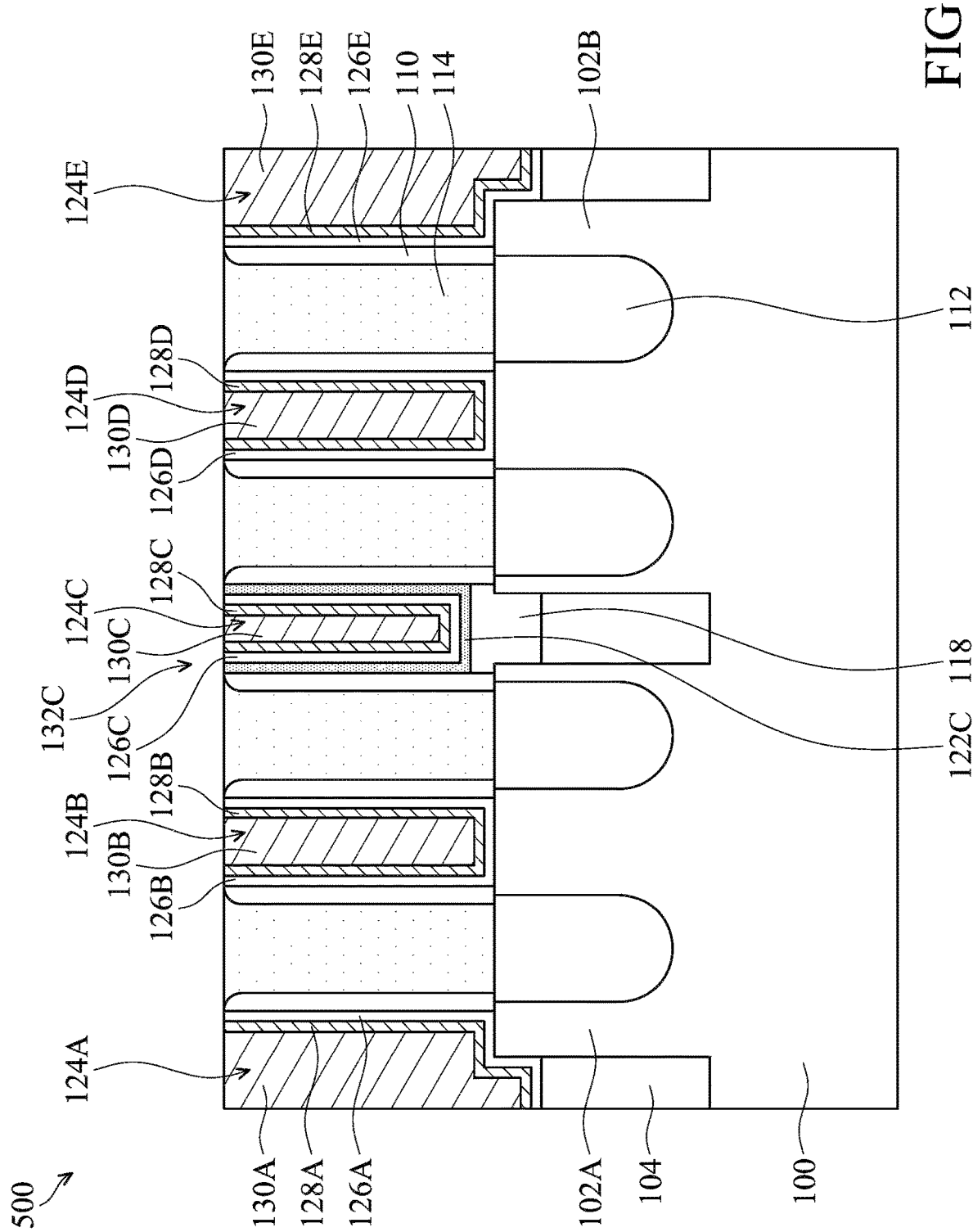
Figure 6A:
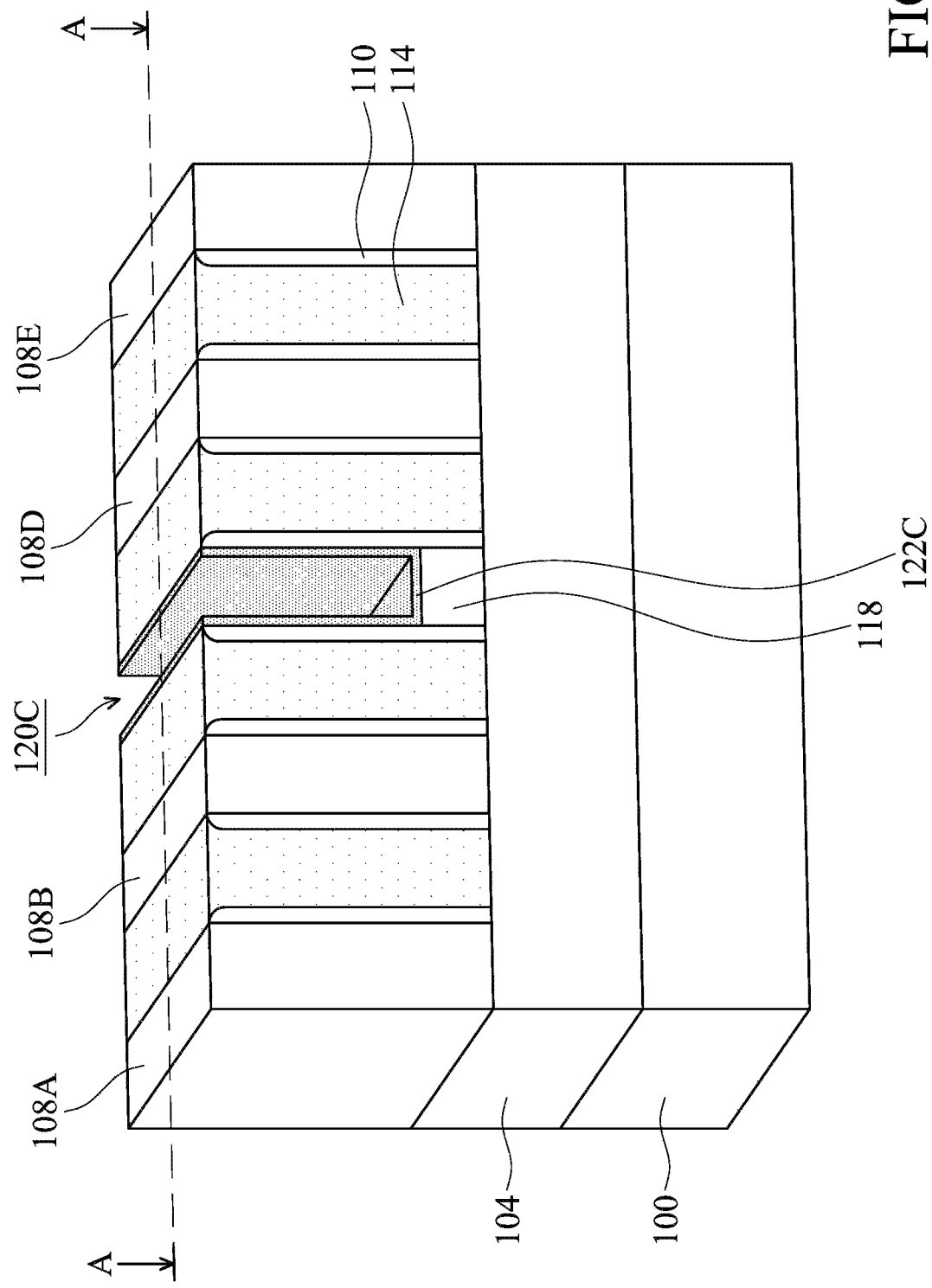
FIGS. 6A-6B are perspective views of various stages of a process for forming a semiconductor device, in accordance with some embodiments.
Figure 6B:
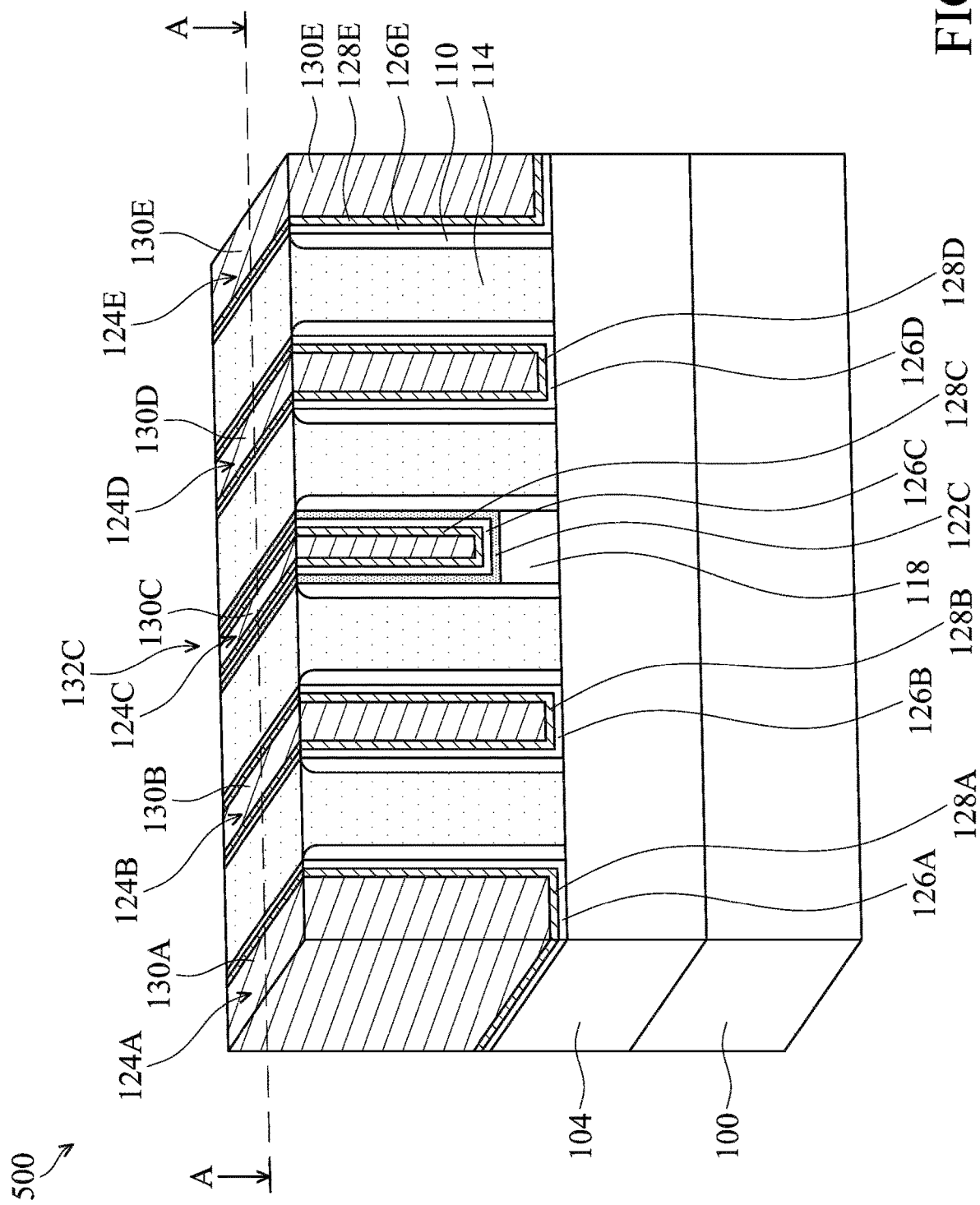

FIGS. 5A-5B are cross-sectional views of various stages of a process for forming a semiconductor device, in accordance with some embodiments. FIGS. 6A-6B are perspective views of various stages of a process for forming a semiconductor device, in accordance with some embodiments. For example, FIGS. 5A-5B are cross-sectional views taken along line A-A in FIGS. 6A-6B.

As shown in FIGS. 5A and 6A, after the removal of the mask layer 116 shown in FIG. 1H, a protection layer 122C is conformally formed in the recess 120C, in accordance with some embodiments. In some embodiments, after the removal of the mask layer 116, a dielectric material layer is conformally deposited in the recess 120C and deposited over the dummy gate stacks 108A, 108B, 108D, 108E and the dielectric layer 114 In some embodiments of the present disclosure, the dielectric material layer is deposited using a CVD process, an ALD process, a spin-on process, a spray coating process, another applicable process, or a combination thereof.

Afterwards, the portion of the dielectric material layer outside the recess 120C may be removed. As a result, the protection layer 122C is formed. In addition, in some embodiments of the present disclosure, since the protection layer 122C is made of a dielectric material, the protection layer 122C is also referred to as a dielectric layer.

As shown in FIGS. 5B and 6B, one or more gate replacement processes are subsequently performed to replace the dummy gate stacks 108A, 108B, 108D and/or 108E with gate stacks 126A, 126B, 124D and 124E to form a semiconductor device 500, in accordance with some embodiments. In some embodiments of the present disclosure, a gate stack 124C is formed over the protection layer 122C in the recess 120C during the replacement of the dummy gate stacks 108A, 108B, 108D and 108E with the gate stacks 124A, 124B, 124D and 124E.

As shown in FIGS. 5B and 6B, the semiconductor layer 118, the protection layer 122C and the gate stack 124C which includes the gate dielectric layer 126C, the work function layer 128C and the conductive filling layer 130C together form a stack structure 132C over the substrate 100, in accordance with some embodiments. In addition, in some embodiments of the present disclosure, portions of the protection layer 122C are formed between the spacer elements 110 and the gate dielectric layer 126C, as shown in FIGS. 5B and 6B.

Embodiments of the disclosure use a semiconductor layer and a protection layer to protect portions of the fin structures during the etching processes for removing the dummy gate stacks. Therefore, the flatness of the fin structures may be maintained, and the quality and reliability of the semiconductor device are significantly improved.

In accordance with some embodiments, a semiconductor device is provided. The semiconductor device includes a substrate and a first fin structure and a second fin structure over the substrate. The semiconductor device also includes a first gate stack and a second gate stack partially covering the first fin structure and the second fin structure, respectively. The semiconductor device further includes a stack structure over the substrate. The stack structure is between the first gate stack and the second gate stack. The stack structure includes a semiconductor layer over the substrate and a protection layer over the semiconductor layer.

In accordance with some embodiments, a semiconductor device is provided. The semiconductor device includes a substrate and a first fin structure and a second fin structure over the substrate. The semiconductor device also includes a first gate stack and a second gate stack traversing over the first fin structure and the second fin structure, respectively. The semiconductor device further includes a stack structure over the substrate. The stack structure is between the first gate stack and the second gate stack. The stack structure includes a first conductive layer over the substrate. The first conductive layer has a top surface which is higher than a top surface of the first fin structure and lower than a top surface of the first gate stack.

In accordance with some embodiments, a method for forming a semiconductor device is provided. The method includes forming a first fin structure and a second fin structure over a substrate and forming first, second and third dummy gate stacks over the substrate. The first dummy gate stack and the second dummy gate stack partially cover the first fin structure and the second fin structure respectively. The third dummy gate stack is between the first dummy gate stack and the second dummy gate stack. The method also includes partially removing the third dummy gate stack such that a semiconductor layer of the third dummy gate stack remains over the substrate. The method further includes forming a protection layer over the semiconductor layer and replacing the first dummy gate stack and second dummy gate stack with a first gate stack and a second gate stack, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first fin structure and a second fin structure over the substrate;
   a first gate stack and a second gate stack partially covering the first fin structure and the second fin structure, respectively; and
   a stack structure over the substrate, wherein the stack structure is between the first gate stack and the second gate stack, wherein the stack structure comprises:
      a semiconductor layer over the substrate and in contact with the first fin structure and the second fin structure;
      a protection layer over the semiconductor layer; and
      a conductive layer over the semiconductor layer, wherein a top surface of the conductive layer is substantially coplanar with a top surface of the first gate stack.

2. The semiconductor device as claimed in claim 1, wherein the stack structure is over the first fin structure and the second fin structure.

3. The semiconductor device as claimed in claim 1, wherein the semiconductor layer comprises polysilicon.

4. The semiconductor device as claimed in claim 1, wherein the conductive layer comprises a work function layer and a conductive filling layer over the work function layer.

5. The semiconductor device as claimed in claim 1, wherein the stack structure further comprises:
   a dielectric layer between the protection layer and the conductive layer.

6. The semiconductor device as claimed in claim 1, further comprising:
   a first dummy gate stack at an end of the first fin structure; and
   a second dummy gate stack at an end of the second fin structure.

7. The semiconductor device as claimed in claim 6, wherein the first dummy gate stack covers a portion of a top surface and a portion of a sidewall of the first fin structure, and the second dummy gate stack covers a portion of a top surface and a portion of a sidewall of the second fin structure.

8. The semiconductor device as claimed in claim 1, wherein a top surface of the protection layer is substantially coplanar with a top surface of the first gate stack.

9. A semiconductor device, comprising:
   a substrate;
   a first fin structure and a second fin structure over the substrate;
   a first gate stack and a second gate stack traversing over the first fin structure and the second fin structure, respectively; and
   a stack structure over the substrate, wherein the stack structure is between the first gate stack and the second gate stack, wherein the stack structure comprises:
      a first conductive layer over the substrate, wherein the first conductive layer has a top surface which is higher than a top surface of the first fin structure and lower than a top surface of the first gate stack;
      a first dielectric layer over the first conductive layer; and a second conductive layer over the first conductive layer.

10. The semiconductor device as claimed in claim 9, further comprising:
an isolation structure over the substrate and surrounding lower portions of the first and second fin structures, wherein the stack structure is positioned over the isolation structure.

11. The semiconductor device as claimed in claim 9, wherein the stack structure is substantially parallel to the first gate stack and the second gate stack.

12. The semiconductor device as claimed in claim 9, wherein a height of a top surface of the second conductive layer is substantially equal to a height of the top surface of the first gate stack.

13. The semiconductor device as claimed in claim 9, wherein a height of a top surface of the first dielectric layer is substantially equal to a height of the top surface of the first gate stack.

14. A semiconductor device, comprising:
a substrate;
a first fin structure and a second fin structure over the substrate;
a first gate stack and a second gate stack traversing over the first fin structure and the second fin structure, respectively;
an isolation structure over the substrate and surrounding the first and second fin structures, wherein a portion of the isolation structure is between the first fin structure and the second fin structure; and
a stack structure over the substrate, wherein the stack structure is between the first gate stack and the second gate stack, wherein the stack structure comprises:
a semiconductor layer over a portion of the first fin structure, over a portion of the second fin structure and over the portion of the isolation structure between the first fin structure and the second fin structure, and in contact with the isolation structure;
a protection layer over the semiconductor layer; and
a conductive layer over the semiconductor layer, wherein a top surface of the conductive layer is substantially coplanar with a top surface of the first gate stack.

15. The semiconductor device as claimed in claim 14, wherein the stack structure is substantially parallel to the first gate stack and the second gate stack.

16. The semiconductor device as claimed in claim 14, wherein the semiconductor layer comprises polysilicon.

17. The semiconductor device as claimed in claim 14, wherein the semiconductor layer is in contact with the first fin structure and the second fin structure.

18. The semiconductor device as claimed in claim 1, wherein the protection layer is between the semiconductor layer and the conductive layer.

19. The semiconductor device as claimed in claim 14, wherein sidewalls of the semiconductor layer are aligned with sidewalls of the protection layer.

20. The semiconductor device as claimed in claim 14, further comprising:
spacer elements over sidewalls of the stack structure, wherein the top surface of the conductive layer is substantially coplanar with a top surface of the spacer elements and a top surface of the protection layer.

* * * * *